United States Patent
Yamanaka

(10) Patent No.: US 7,276,429 B2
(45) Date of Patent: Oct. 2, 2007

(54) METHOD AND APPARATUS FOR PRODUCING ULTRA-THIN SEMICONDUCTOR CHIP AND METHOD AND APPARATUS FOR PRODUCING ULTRA-THIN BACK-ILLUMINATED SOLID-STATE IMAGE PICKUP DEVICE

(75) Inventor: Hideo Yamanaka, Kumamoto (JP)

(73) Assignee: Sony Corporation, Tokyo (JP)

(*) Notice: Subject to any disclaimer, the term of this patent is extended or adjusted under 35 U.S.C. 154(b) by 264 days.

(21) Appl. No.: 11/196,967

(22) Filed: Aug. 4, 2005

(65) Prior Publication Data

US 2005/0282306 A1    Dec. 22, 2005

Related U.S. Application Data

(62) Division of application No. 10/680,548, filed on Oct. 7, 2003, now Pat. No. 7,157,352.

(30) Foreign Application Priority Data

Oct. 11, 2002    (JP) ............................. 2002-299563

(51) Int. Cl.
*H01L 21/30* (2006.01)

(52) U.S. Cl. ................. 438/455; 438/457; 438/458; 257/E21.599

(58) Field of Classification Search ............ 438/455, 438/457, 459; 257/E21.599
See application file for complete search history.

(56) References Cited

U.S. PATENT DOCUMENTS

| 5,453,394 A | 9/1995 | Yonehara et al. |
| 6,194,245 B1 | 2/2001 | Tayanaka |
| 6,682,990 B1 * | 1/2004 | Iwane et al. ............... 438/458 |
| 2003/0203547 A1 | 10/2003 | Sakaguchi et al. |
| 2005/0074954 A1 | 4/2005 | Yamanaka |

* cited by examiner

*Primary Examiner*—Bradley K Smith
(74) *Attorney, Agent, or Firm*—Sonnenschein Nath & Rosenthal LLP

(57) ABSTRACT

A method for producing an ultra-thin semiconductor chip and an ultra-thin back-illuminated solid-state image pickup device utilizing a semiconductor layer formed on a support substrate via an insulating layer to improve separation performance of a semiconductor layer from a support substrate and thereby improve the productivity and quality. The method uses two porous peeling layers on opposite sides of a substrate to produce an ultra-thin substrate.

26 Claims, 24 Drawing Sheets

METHOD AND APPARATUS FOR PRODUCING ULTRA-THIN SEMICONDUCTOR CHIP AND METHOD AND APPARATUS FOR PRODUCING ULTRA-THIN BACK-ILLUMINATED SOLID-STATE IMAGE PICKUP DEVICE

The present application is a divisional of U.S. application Ser. No. 10/680,548, filed Oct. 7, 2003 now U.S. Pat. No. 7,157,352, which claims the benefit of and priority to Japanese Application No. JP 2002-299563 filed Oct. 11, 2001. The contents of all these applications are incorporated herein by reference to the extent permitted by law.

BACKGROUND OF THE INVENTION

1. Field of the Invention

The present invention relates to an ultra-thin semiconductor chip according to a new ultra-thin silicon-on-insulator (SOI) substrate production method, more particularly a method and an apparatus for producing a back-illuminated solid-state image pickup device for detecting light incident from a back side of the substrate of an ultra-thin single-surface resin sealed chip size hollow package according to the new ultra-thin SOI substrate production method.

2. Description of the Related Art

For an image sensor having sensitivity with respect to an input of UV rays, soft X-rays, or an electron beam, use is being made of a back-illuminated charge coupled device (CCD) etc.

Namely, UV rays, soft X-rays, and electron beams have a large absorption coefficient, so a CCD having no polycrystalline silicon electrodes or other obstacle at the incident surface, that is, a back-illuminated CCD illuminated from the back of the CCD forming surface is preferred.

A usual silicon substrate has a thickness of 400 to 500 µm, however, so it cannot be used as is for a back-illuminated. Therefore the back of this silicon substrate is made thinner mechanically and chemically, that is, by grinding down the back, by grinding down the back and polishing the back, or by grinding down the back and chemical etching.

The technology disclosed in for example Japanese Unexamined Patent Publication (Kokai) No. 6-326293 comprises first forming a polyimide resin film on a substrate surface having a CCD back-illuminated function formed thereon, affixing substitute silicon substrate on this, grinding down the entire back of the CCD substrate, then polishing the back to a mirror surface state. Next, it calls for chemically etching the polished substrate surface to remove the altered layer near the front surface of the substrate caused due to the mechanical grinding and thereby obtain a back-illuminated light detection substrate having a desired substrate thickness.

Further, the technology disclosed in Japanese Unexamined Patent Publication (Kokai) No. 7-245386 comprises forming a silicon nitride film on the back of the substrate having the CCD back-illuminated function formed thereon, removing the silicon nitride film at the center of the back of the chip where light etc. will strike while leaving the silicon nitride film at the chip periphery in a frame state and using it as a mask at the time of silicon chemical etching, and chemically etching the back to thereby obtain a predetermined thickness of 10 to 20 µm.

Summarizing the problems to be solved by the invention, with such mechanical, chemical, or mechanical and chemical methods, variation occurs in the substrate thickness needed at the center of the back of the chip where light etc. will strike, the light reception sensitivity of the CCD sensor will become uneven, fixed pattern noise due to dark current will increase, and other problems will easily arise.

Further, a chip becomes susceptible to mechanical shock and temperature changes along with the reduction of the thickness, so breaks, becomes chipped, etc. leading to a drop in the yield and the quality. Also, the increase in the number of work steps leads to a deterioration of the productivity and consequently an unavoidable increase in costs.

Japanese Unexamined Patent Publication (Kokai) No. 2001-267542 discloses technology concerning an infrared ray sensor comprised of an SOI layer formed with a pn junction, while Japanese Unexamined Patent Publication (Kokai) No. 2000-88640 and Japanese Unexamined Patent Publication (Kokai) No. 9-166497 disclose technology concerning an infrared ray detector utilizing an SOI substrate.

Accordingly, in a back-illuminated solid-state image pickup device as well, it is also considered to utilize an SOI layer as a thin semiconductor layer for back-illuminated to eliminate the mechanical and chemical polishing. In actuality, Japanese Unexamined Patent Publication (Kokai) No. 10-209417 discloses technology concerning a solid-state image pickup device for detecting X-rays, y-rays, and charged particles utilizing a bonded SOI substrate.

Here, the problems occurring when trying to fabricate a thin semiconductor chip and a thin back-illuminated solid-state image pickup device by utilizing the well known SOI substrate fabrication processes will be explained in detail below.

At the present, as methods for the production of an SOI substrate, the ELTRAN (epitaxial layer transfer (Canon)) method, hydrogen ion peeling method (also referred to as the "SMART CUT method" (Commissariat a l'Energie Atomique; France)), the SIMOX method, etc. are known.

The ELTRAN method disclosed in Japanese Patent No. 2608351, well known ELTRAN technical papers, etc. comprises first chemically processing a seed Si wafer surface to a sponge structure of a porous Si layer formed with innumerable fine holes having a diameter of 0.01 µm by anodic oxidation. Then, it calls for epitaxially growing a single crystalline Si layer on this porous Si layer. Further, it thermally oxidizes this single crystalline Si layer surface to form an insulating film, bonds this with a handle Si wafer, then separates the seed Si wafer at the porous layer by a water jet. Next, it removes the porous layer left on the handle Si wafer by ultra-high selective etching and finally flattens the surface by hydrogen annealing to thereby fabricate the SOI substrate.

That is, this is a bond and etch-back silicon-on-insulator (BESOI) structure obtained by a combination of epitaxial growth and surface flattening by hydrogen annealing on a porous Si layer processable by ultra-high selective etching.

The above method is characterized by separating the seed Si wafer at the porous Si layer by a water jet, but the thinner this single crystalline Si layer and the larger the wafer size, the harder the separation and the more easily problems arise in the yield and quality due to breakage, chipping, cracks, etc.

Further, the technology disclosed in Japanese Unexamined Patent Publication (Kokai) No. 11-195562 calls for forming a plurality of porous Si layers having different porosities as the above porous layer to thereby facilitate the peeling, but in this case as well, similarly, at the time of peeling by tension the porous Si layer, problems easily arise in the yield and quality due to breakage, chipping, cracks, etc.

The hydrogen ion separation method (SMARTCUT method) comprises forming a hydrogen ion implanted layer at a location of a predetermined depth from the Si wafer surface, bonding the result with an Si wafer separately thermally oxidized to form an insulating film, then heat treating the result and peeling the layers apart at the hydrogen ion implanted layer and finally flattening the surface by hydrogen annealing to thereby fabricate an SOI substrate (refer to for example Japanese Patent No. 3048201, Japanese Unexamined Patent Publication (Kokai) No. 2000-196047, Japanese Unexamined Patent Publication (Kokai) No. 2001-77044, and Japanese Unexamined Patent Publication (Kokai) No. 5-211128).

The above method is characterized by causing strain in the high hydrogen ion implanted layer by the action of the pressure in the micro bubbles of hydrogen and the action of crystal realignment and pulling apart and separating the two substrates. In this method as well, the thinner this single crystalline Si layer and the larger the wafer size, the harder the separation and easier problems arise in the yield and quality due to breakage, chipping, cracks. etc.

As explained above, when trying to fabricate a thin semiconductor chip and a thin back-illuminated solid-state image pickup device by utilizing these well known SOI substrate fabrication processes, in each case, separation becomes difficult when the wafer size becomes large and consequently there is a problem in the yield, quality, and reliability due to breakage, chipping, cracks, etc.

SUMMARY OF THE INVENTION

An object of the present invention is to provide a method and an apparatus for producing an ultra-thin semiconductor chip, more particularly an ultra-thin back-illuminated solid-state image pickup device, utilizing a single crystalline semiconductor layer formed on a single crystalline support substrate (hereinafter referred to as a "support substrate") via an insulating layer and improving a separation performance of this single crystalline semiconductor layer from the support substrate so as to enable an improvement of the yield, quality, and productivity.

To attain the above object, according to a first aspect of the present invention, there is provided a method of production of a thin semiconductor chip comprising the steps of forming a first single crystalline semiconductor layer on a single crystalline seed substrate (hereinafter referred to as a "seed substrate") via a first porous semiconductor peeling layer; bonding the seed substrate from the first single crystalline semiconductor layer side to a support substrate having a second single crystalline semiconductor layer formed thereon via a second porous semiconductor peeling layer via an insulating layer; separating the seed substrate using the first porous semiconductor peeling layer as an interface; and separating the support substrate using the second porous semiconductor peeling layer as an interface to obtain the first single crystalline semiconductor layer formed on the insulating layer. It produces an ultra-thin semiconductor chip by an ultra-thin SOI substrate by the so-called double porous layer separation method.

Further, in order to improve the peeling of the ultra-thin SOI substrate from the support substrate, according to a second aspect of the present invent, there is provided a the method of production of an ultra-thin semiconductor chip, particularly an ultra-thin back-illuminated solid-state image pickup device, comprising the steps of forming a base comprised of a support substrate on which a second porous semiconductor peeling layer, a second single crystalline semiconductor layer, an insulating layer, and a first single crystalline semiconductor layer are stacked and forming a semiconductor device unit, particularly a solid-state image pickup sensor unit, and projecting connection electrodes to be connected to the semiconductor device unit, particularly a solid-state image pickup sensor unit, at the first single crystalline semiconductor layer; forming a score by for example blade dicing along a separation line for separation to an individual semiconductor chip, particularly a solid-state image pickup device, from the first single crystalline semiconductor layer side until at least the second porous semiconductor peeling layer of the base is reached; forming a resin protective film filling an interior of the score and covering the surface of the first single crystalline semiconductor layer; exposing the projecting connection electrodes at the surface by polishing one surface of the resin protective film; covering the resin protective film surface and the projecting connection electrode surfaces by a conductive protective tape free from residual conductive adhesive, for example, an UV-ray curable tape; peeling off the support substrate using the second porous semiconductor peeling layer as an interface; and dicing by for example blade dicing from the second crystalline semiconductor layer side along the resin protective film filled in the score to separate an individual semiconductor chip, particularly a solid-state image pickup device.

According to a third aspect of the present invention, there is provided a method of production of an ultra-thin semiconductor chip comprising the steps of forming a first single crystalline semiconductor layer on a seed substrate via for example a hydrogen ion implanted first ion implanted peeling layer; bonding the seed substrate from the first single crystalline semiconductor layer side to a support substrate via an insulating layer; separating the seed substrate using the first ion implanted peeling layer as an interface; and separating the support substrate using for example a hydrogen ion implanted second ion implanted peeling layer as an interface to obtain the first single crystalline semiconductor layer formed on the insulating layer. It produces an ultra-thin semiconductor chip by an ultra-thin SOI substrate by a so-called double ion implanted layer separation method.

Further, in order to improve the peeling of the ultra-thin SOI substrate from the support substrate, according to a fourth aspect of the present invention, there is provided a method of production of an ultra-thin semiconductor chip, particularly an ultra-thin back-illuminated solid-state image pickup device, of the present invention, comprising the steps of forming a base comprised of a support substrate on which for example a hydrogen ion implanted second ion implanted peeling layer, a second single crystalline semiconductor layer, an insulating layer, and a first single crystalline semiconductor layer are stacked and forming a semiconductor device unit, particularly a solid-state image pickup sensor unit, and projecting connection electrodes to be connected to the semiconductor device unit, particularly solid-state image pickup sensor unit, at the first single crystalline semiconductor layer; forming a score by for example blade dicing along a separation line for separation to an individual semiconductor chip, particularly solid-state image pickup device, from the first single crystalline semiconductor layer side until at least the second ion implanted peeling layer of the base is reached; forming a resin protective film filling an interior of the score and covering the surface of the first single crystalline semiconductor layer; exposing the projecting connection electrodes at the surface by a polishing one surface of the resin protective film; covering the resin protective film surface and the projecting connection electrode surfaces by a conductive protective tape free from residual conductive adhesive; peeling off the support substrate using the second ion implanted peeling layer as an interface; and dicing by for example blade dicing from the second crystalline semiconductor layer side along the resin protective film filled in the score to separate an individual semiconductor chip, particularly solid-state image pickup device. Note that, in the ion implantation, other than hydrogen, a dilution gas of nitrogen, helium, etc. can also be used.

According to a fifth aspect of the present invention, there is provided a method of production of an ultra-thin semiconductor chip comprising the steps of forming a single crystalline semiconductor layer on a seed substrate via for example a hydrogen ion implanted first ion implanted peeling layer; bonding the seed substrate to a support substrate having a porous semiconductor peeling layer formed thereon from the single crystalline semiconductor layer side via an insulating layer; separating the seed substrate using the ion implanted peeling layer as an interface; and separating the support substrate using the porous semiconductor peeling layer as an interface to obtain the single crystalline semiconductor layer formed on the insulating layer. It produces the ultra-thin semiconductor chip by an ultra-thin SOI substrate according to a so-called porous layer/ion implanted layer separation method.

Further, in order to improve the peeling of the ultra-thin SOI substrate from the support substrate, according to a sixth aspect of the present invention, there is provided a method of production of an ultra-thin semiconductor chip, particularly an ultra-thin back-illuminated solid-state image pickup device, comprising the steps of forming a base comprised of a support substrate on which a porous semiconductor peeling layer, a second single crystalline semiconductor layer, an insulating layer, and a first single crystalline semiconductor layer are stacked and forming a semiconductor device unit, particularly a solid-state image pickup sensor unit, and projecting connection electrodes to be connected to the semiconductor device unit, particularly the solid-state image pickup sensor unit, at the first single crystalline semiconductor layer; forming a score along a separation line for separation to an individual semiconductor chip, particularly solid-state image pickup device, from the first single crystalline semiconductor layer side until at least the porous semiconductor peeling layer of the base is reached; forming a resin protective film filling an interior of the score and covering the surface of the first single crystalline semiconductor layer; exposing the projecting connection electrodes at the surface by polishing one surface of the resin protective film; covering the resin protective film surface and the projecting connection electrode surfaces by a conductive protective tape free from residual conductive adhesive; peeling off the support substrate using the porous semiconductor peeling layer as an interface; and dicing from the second crystalline semiconductor layer side along the resin protective film filled in the score to separate an individual semiconductor chip, particularly solid-state image pickup device.

In the present invention, in order to produce an ultra-thin semiconductor chip, particularly an ultra-thin back-illuminated solid-state image pickup device, comprised of a first single crystalline semiconductor layer on which a semiconductor device unit, particularly a solid-state image pickup sensor unit, and projecting connection electrodes to be connected to the semiconductor device unit, particularly the solid-state image pickup sensor unit, are formed, the present invention uses a base comprised of a support substrate on which an ion implanted layer or porous substance peeling layer, second single crystalline semiconductor layer, insulating layer, and first single crystalline semiconductor layer are stacked and improves the peeling of the support substrate by adopting the following steps.

First, it forms a score by for example blade dicing along a separation line for separating an individual semiconductor chip, particularly a solid-state image pickup device, from the first single crystalline semiconductor layer side until at least the ion implanted layer or the porous peeling layer of the base is reached.

Then, it forms a resin protective film filling the interior of the score and covering the surface of the first single crystalline semiconductor layer so as to impart strain of curing shrinkage stress of the resin protective film to the peeling layer of the support substrate to thereby facilitate peeling of the support substrate using the peeling layer as an interface.

Further, it polishes one surface of the resin protective film to expose the projecting connection electrodes at the surface and covers the resin protective film surface and the projecting connection electrode surfaces by a conductive protective tape free from residual conductive adhesive, for example, a UV-ray curable tape, to prevent static electricity damage up to the time of peeling and the time of mounting on a mounting board.

Further, it peels off the support substrate using the porous semiconductor peeling layer as an interface, then separates an individual semiconductor chip, particularly solid-state image pickup device, by for example blade dicing from the second single crystalline semiconductor layer side along the resin protective film filled in the score.

By this, a single-surface resin sealed ultra-thin semiconductor chip, particularly a single-surface resin sealed ultra-thin back-illuminated solid-state image pickup device, is produced.

According to a seventh aspect of the present invention, there is provided a production apparatus of an ultra-thin semiconductor chip, particularly a production apparatus of an ultra-thin back-illuminated solid-state image pickup device, discharging to a substrate having at least two porous semiconductor peeling layers inside it for example a liquid (water, an etching solution, alcohol, etc.), a gas (air, nitrogen, argon, etc.), a mixture of a liquid and a gas mixing the gas in the liquid in an appropriate ratio, or a fluid of the same containing ultra-fine particle powder of solid granules and powder (polishing agent, ice, pieces of plastic, etc.) from one or more fine nozzles to separate the substrate at a predetermined porous semiconductor peeling layer as an interface during rotation, which production apparatus of an ultra-thin semiconductor chip, particularly production apparatus of an ultra-thin back-illuminated solid-state image pickup device, has support portions for rotatably supporting front and backs of the substrate; a discharge portion for discharging the fluid toward a porous semiconductor peeling layer; and a stopper portion for preventing the fluid from the discharging portion from striking other porous semiconductor peeling layers.

According to the production apparatus of an ultra-thin semiconductor chip, particularly the production apparatus of an ultra-thin back-illuminated solid-state image pickup device, of the above present invention, since there is provided a stopper portion for preventing fluid from the discharging portion from striking the other porous semiconductor peeling layers when discharging fluid to a substrate having at least two porous semiconductor peeling layers inside it to separate the substrate using a predetermined porous semiconductor peeling layer as an interface, the peeling action by the fluid is prevented from acting upon the other porous semiconductor peeling layers and the substrate is separated using the intended porous semiconductor peeling layer as an interface.

According to an eighth aspect of the present invention, there is provided a production apparatus of an ultra-thin semiconductor chip, particularly a-production apparatus of an ultra-thin back-illuminated solid-state image pickup device, separating a substrate having at least two porous semiconductor peeling layers or ion implanted peeling layers obtained by ion implantation inside it using a predetermined porous semiconductor peeling layer or ion implanted peeling layer as an interface, the production apparatus of an ultra-thin semiconductor chip, particularly the production apparatus of an ultra-thin back-illuminated solid-state image pickup device comprising support portions for rotatably supporting front and back of the substrate and a laser output portion for emitting a laser beam toward the predetermined porous semiconductor peeling layer or ion implanted peeling layer.

BRIEF DESCRIPTION OF THE DRAWINGS

The above object and features of the present invention will be more apparent from the following description of the preferred embodiments given with reference to the accompanying drawings, wherein.

DESCRIPTION OF THE PREFERRED EMBODIMENTS

Figure 1A:
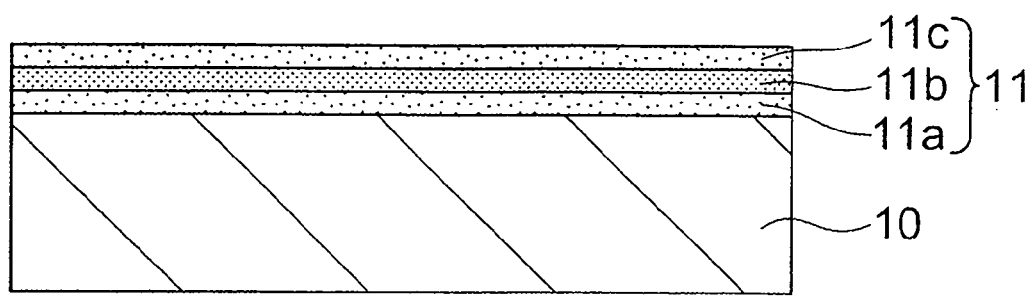
FIGS. 1A and 1B are sectional views of the state after formation of a porous Si layer in production of a back-illuminated solid-state image pickup device according to a first embodiment of the present invention.

Below, an explanation will be given of embodiments of a method of production and a production apparatus of a back-illuminated solid-state image pickup device of a single-surface resin sealed ultra-thin chip size hollow package according to a method of production of an ultra-thin SOI substrate of the present invention with reference to the drawings.

First Embodiment

In the present embodiment, the explanation will be given of a method of production and production apparatus of a back-illuminated solid-state image pickup device of a single-surface resin sealed ultra-thin chip size hollow package using the double porous layer separation method (for example the method of separating a seed substrate by a first porous Si layer formed on a seed substrate and separating the support substrate by a second porous Si layer formed on the support substrate) among the methods of fabrication of new ultra-thin SOI substrates.

Step 1: Formation of Porous Layer

In this step, a porous Si layer is formed on a seed wafer (hereinafter referred to as a "seed substrate") and a handle wafer (hereinafter referred to as a "support substrate") by anodization. At this time, in order to facilitate separation of the seed substrate, a thickness and porosity of the high porous Si layer on the seed substrate are formed larger than those of the porous Si layer on the support substrate.

Note that, as the seed substrate and support substrate use semiconductor substrates used here, not only a single crystalline Si substrate prepared by a CZ process, an MCZ process, or an FZ process, but also a single crystalline Si substrate having a hydrogen annealed substrate surface, an epitaxial single crystalline Si substrate, etc. can be used.

Of course, the invention is not limited to an Si substrate. Use can be also made of an SiGe substrate and further an SiC substrate, a GaAs substrate, an InP substrate, or other single crystalline compound semiconductor substrate.

When forming the porous Si layer by anodic conversion, the porous Si layer can be comprised of a plurality of layers having different porosities.

For example, it is also possible to employ a three-layer structure of a first low porous Si layer, a high porous Si layer, and a second low porous Si layer on the support substrate and possible to employ a two-layer structure of a high porous and a low porous Si layer on a support substrate.

The porosity of the high porous Si layer may be for example 40 to 80%. A low porous Si layer having a porosity within a range from for example 10 to 30% can be utilized.

By changing the current density and application time at the time of anodic conversion or the type or concentration of a conversion solution at the time of the anodic conversion, a plurality of layers having different porosities can be formed to any thicknesses.

Below, details of the steps will be explained.

First, a seed substrate 10 made of a p-type Si single crystal of an 8 inch diameter and 800 μm thickness (resistivity of 0.01 to 0.02 Ωcm) is doped with boron by CVD of monosilane or diborane gas to a concentration of about $1 \times 10^{19}/cm^3$ to thereby form a high concentration p-type impurity layer made of an epitaxially grown single crystalline Si layer containing an impurity at a high concentration to a thickness of about 10 μm.

Then, the surface of this high concentration p-type impurity layer is doped with boron by CVD of monosilane or diborane gas to a concentration of about $5 \times 10^{14}/cm^3$ to form a low concentration p-type impurity layer made of an epitaxially grown single crystalline Si layer containing an impurity at a low concentration to a thickness of about 20 μm.

Further, the surface of this low concentration p-type impurity layer is doped with boron by CVD of monosilane or diborane gas to a concentration of about $5 \times 10^{19}/cm^3$ to form a high concentration p-type impurity layer made of an epitaxially grown single crystalline Si layer containing an impurity at a high concentration to a thickness of about 5 μm.

Note that, when the semiconductor film is a single crystalline Si layer, as the feedstock gas, other than $SiH_4$ (monosilane), use can be also made of $SiH_2Cl_2$, $SiHCl_3$, or $SiCl_4$.

Next, by anodic conversion, for example a liquid mixture obtained by mixing 50% hydrogen fluoride solution and ethyl alcohol by a volume ratio of 2:1 is used as an electrolytic solution. This is circulated for about 5 minutes at a current density of 10 mA/cm². This anodic conversion supplies power in the electrolytic solution using the substrate as an anode. The technology of this anodic conversion is disclosed in Ito et al., "*Anodic Conversion of Porous Silicon*", Surface Technology, vol. 46, no. 5, p. 8 to 13, 1995.

In this anodic conversion, the porosity is determined according to the concentration of impurity in the layer for forming the porous layer, the density of the electric current passed, the concentration of the electrolytic solution, etc. For example, the lower the impurity concentration, the higher the porosity, and the higher the impurity concentration, the lower the porosity.

Accordingly, as shown in FIG. 1A, the seed substrate 10 is successively formed with the high concentration p-type impurity layer, the low concentration p-type impurity, and the high concentration p-type impurity layer, then, after this anodic conversion, the seed substrate 10 is formed with a porous Si layer 11 comprising a low porous Si layer 11a of a low porosity having a thickness of about 10 μm, a high porous Si layer 11b of a high porosity having a thickness of about 20 μm, and a low porous Si layer 11c of a low porosity having a thickness of about 5 μm.

In the same way as the above description, a support substrate 20 comprised of a p-type Si single crystal of 8 inch diameter and 800 μm thickness (resistivity of 0.01 to 0.02 Ωcm) is doped with boron by CVD of monosilane or diborane gas to a concentration of about $1 \times 10^{19}/cm^3$ to form a high concentration p-type impurity layer made of an epitaxially grown single crystalline Si layer containing an impurity at a high concentration to a thickness of about 10 μm.

Then, the surface of this high concentration p-type impurity layer is doped with boron by CVD of monosilane or diborane gas to a concentration of about $1 \times 10^{15}/cm^3$ to form a low concentration p-type impurity layer made of an epitaxially grown single crystalline Si layer containing an impurity at a low concentration to a thickness of about 2 μm.

Further, the surface of this low concentration p-type impurity layer is doped with boron by CVD of monosilane or diborane gas to a concentration of about $3 \times 10^{19}/cm^3$ to form a high concentration p-type impurity layer made of an epitaxially grown single crystalline Si layer containing an impurity at a high concentration to a thickness of about 10 μm.

Note that, in the same way as the above description, when the semiconductor film is a single crystalline Si layer, as the feedstock gas, other than $SiH_4$ (monosilane), use can be also made of $SiH_2Cl_2$, $SiHCl_3$, or $SiCl_4$.

Figure 1B:
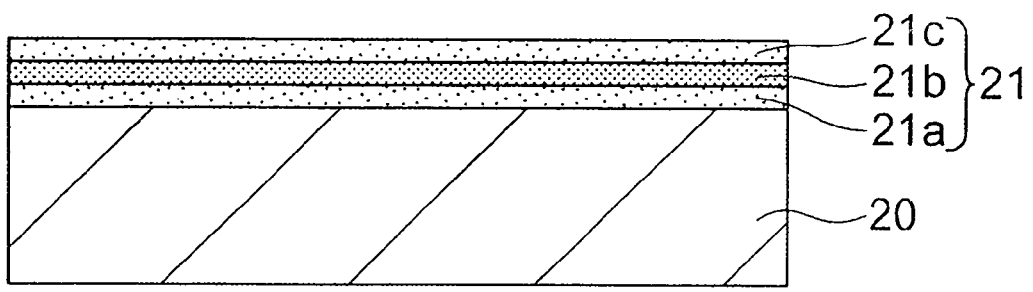

Next, by anodic conversion in the same way as the above, for example a mixture obtained by mixing 50% hydrogen fluoride solution and ethyl alcohol at a volume ratio of 2:1 is used as the electrolytic solution and circulated for about 5 minutes at a current density of 10 mA/cm² to change the high concentration p-type-impurity layer to a low porous Si layer of a low porosity and is change the low concentration p-type impurity layer to a high porous Si layer of a high porosity. By this, as shown in FIG. 1B, the support substrate 20 is formed with a porous Si layer 21 comprising a low porous Si layer 21a of a low porosity having a thickness of about 10 μm, a high porous Si layer 21b of a high porosity having a thickness of about 2 μm, and a low porous Si layer 21c of a low porosity having a thickness of about 10 μm.

After the formation of the porous Si layer 11 on the seed substrate 10 and the formation of the porous Si layer 21 on the support substrate 20, dry oxidation is preferably performed at about 400° C. to oxidize the inner walls of the holes of the porous Si to about 1 to 3 nm and thereby prevent the porous Si layer from structurally changing due to high temperature treatment.

In a dissolution reaction of Si in the above anodic conversion, positive holes are needed for the anode reaction of Si in the HF solution. Therefore, the substrate is preferably a p-type silicon easily made porous.

The low porous Si layers 11a, 11c, 21a, and 21c preferably have a high impurity concentration ($1\times10^{19}$/cm³ or more) and a low porosity (about 10 to 30%). At this time, in order to form a semiconductor layer made of single crystalline Si having excellent crystallinity for forming the device of the solid-state image pickup device in the next step on the low porous Si layer 11c, the porosity and the thickness of the low porous Si layer 11c are preferably made smaller than those of the low porous Si layer 21c.

Further, the high porous Si layers 11b and 21b preferably have a low impurity concentration ($1\times10^{19}$/cm³ or less) and a high porosity (about 40 to 70%). In this case, in the following steps, in order to facilitate peeling of the seed substrate 10 and prevent peeling of the support substrate 20 at the time of peeling of the seed substrate 10, the porosity and the thickness of the high porous Si layer 11b are preferably made larger than those of the high porous Si layer 21b.

Step 2: Formation of Semiconductor Layer and Insulating Film

In this step, epitaxially grown single crystalline Si layers are formed on both substrates of the seed substrate 10 and the support substrate 20, and a silicon oxide film or a multilayer film of a silicon oxide film, a silicon nitride film, and a silicon oxide film is formed on at least one substrate as the insulating film. Below, details of this step will be explained.

Both substrates of the seed substrate 10 and the support substrate 20 are pre-baked in a hydrogen atmosphere at about 1000 to 1100° C. in a CVD epitaxial growth apparatus to seal holes at the surfaces of the porous Si layers 11 and 21 to flatten the surfaces.

Figure 2A:
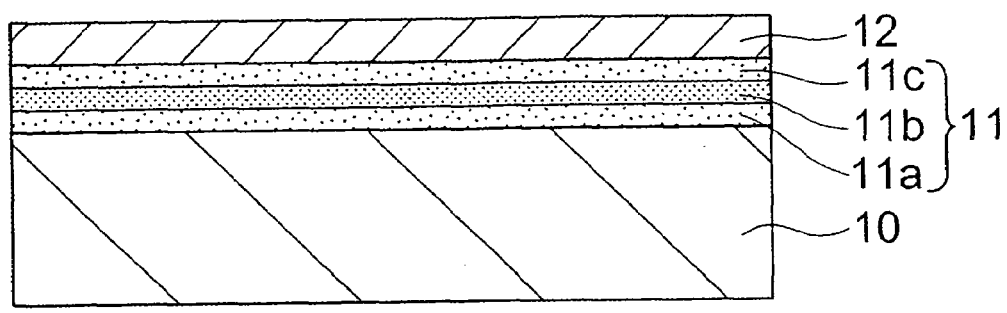
FIGS. 2A and 2B are sectional views of the state after the step of formation of a semiconductor layer and an insulating layer in a production of a back-illuminated solid-state image pickup device according to the first embodiment.
Figure 2B:
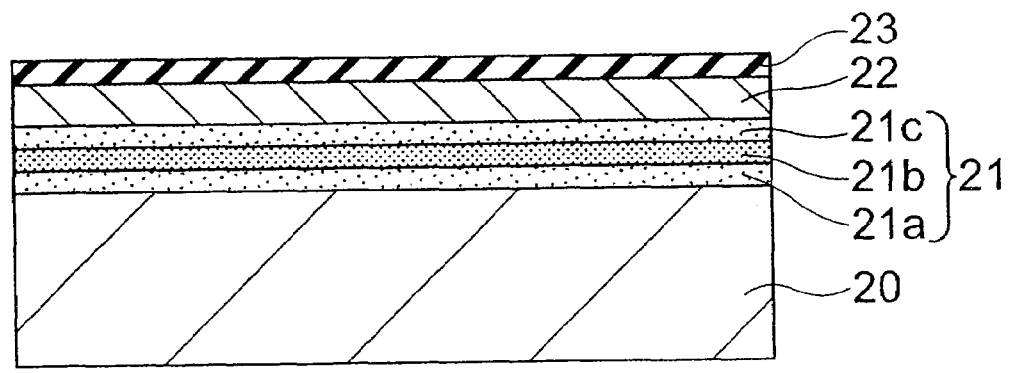

Next, the temperature is reduced to 1020° C. and CVD is carried out using silane gas or diborane gas as the feedstock gas to form epitaxially grown semiconductor layers made of p-type single crystalline Si layers having a thickness of 5 to 20 μm on the seed substrate 10 and the support substrate 20. For example, as shown in FIG. 2A, a first semiconductor layer 12 having a thickness of about 5 to 10 μm made of a p-type single crystalline Si layer is formed on the porous Si layer 11 of the seed substrate 10, and as shown in FIG. 2B, a second semiconductor layer 22 having a thickness of about 15 to 20 μm made of a p-type single crystalline Si layer is formed on the porous Si layer 21 of the support substrate 20.

The impurity concentration at this time can be freely controlled according to the intended characteristics, but needless to say not only a p-type, but also an n-type single crystalline Si layer can be formed in accordance with the type and characteristics of the device.

As the thicknesses of the first semiconductor layer 12 and the second semiconductor layer 22, the thickness of the second semiconductor layer 22 of the support substrate 20 is set at least equivalent to the thickness of the first semiconductor layer 12 of the seed substrate 10.

This was set for reduction and prevention of strain at the first semiconductor layer 12 due to expansion by thermal oxidation of the porous Si layer 21 during the device process to the first semiconductor layer 12 in the following steps.

It is necessary to set the thickness of the first semiconductor layer 12 for the device fabrication to a thickness of about 5 to 20 μm since sensitivity with respect to the incident light for the back-illuminated is necessary. Further, the second semiconductor layer 22 and the low porous Si layer 21c are removed in the end as will be explained later and thereby an air gap (height) is defined between the seal glass and the incident surface, so the total thickness of the second semiconductor layer 22 and the low porous Si layer 21c preferably becomes about 10 to 50 μm.

Next, at least one of the first semiconductor layer 12 of the seed substrate 10 or the second semiconductor layer 22 of the support substrate 20 is formed with an insulating film 23 made of silicon oxide or the like having a thickness of for example about 200 to 300 nm. As shown in FIG. 2B, in the present embodiment, an example of forming the insulating film 23 on the support substrate 20 is shown.

Note that this insulating film 23 may also be a single layer of silicon oxide formed by thermal oxidation, CVD, or the like, but may also be a silicon oxynitride film or multilayer films of a silicon oxide film/silicon nitride film or a silicon oxide film/silicon nitride film/silicon oxide film obtain by using reduced pressure CVD to form a silicon nitride film on the second semiconductor layer 22 and thermally oxidizing this. In this case, for example, the thickness of the silicon oxide film is set to about 200 nm, the thickness of the silicon nitride film is set to about 50 nm, and the thickness of the silicon oxide film is set to about 200 nm.

In this way, since there is a nitride-based silicon film having an appropriate thickness, contamination by a halogen element from the support substrate 20 side at the time of for example packaging or during a device process can be prevented. Further, reduction and prevention of warping and strain of the epitaxially grown first semiconductor layer 12 for device fabrication due to the expansion by the oxidation of the porous Si layer 21 during the device process can be achieved. Further, there is the effect that a high precision sensor unit can be prepared since it acts as an etching stopper at the time of the etching away the second semiconductor layer 22 and the porous Si layer 21 under the insulating film 23.

Step 3: Bonding

Figure 3A:
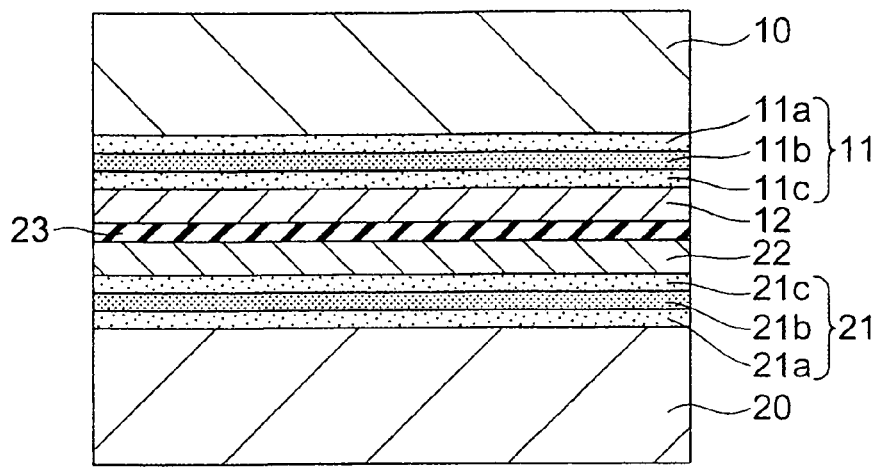
FIGS. 3A and 3B are sectional views of the state after bonding of substrates and peeling off a seed substrate in the production of a back-illuminated solid-state image pickup device according to the first embodiment.

As shown in FIG. 3A, the first semiconductor layer 12 of the seed substrate 10 and the insulating film 23 of the support substrate 20 are brought into contact at a room temperature and bonded by Van der Waals force. After this, heat treatment is carried out to cause covalent bonding to strengthen the bond.

At this time, it is confirmed if there is any dust or dirt on the surfaces of the two substrates 10 and 20. If there is any foreign matter, this is peeled off and washed away.

Further, the heat treatment is preferably carried out in nitrogen or an inert gas or a mixed gas of nitrogen and an inert gas. For example, by setting the heat treatment temperature at 400° C. and performing the treatment for 30 minutes, the bond can be made stronger.

Further, it is also possible to set two superimposed substrates in a reduced pressure heat treatment furnace and hold them at a predetermined pressure (for example 133 Pa or less) by evacuation, bring them into close contact by application of pressure at the time of breaking to atmospheric pressure after a predetermined time, then heat the two in nitrogen or an inert gas or the mixed gas of nitrogen and an inert gas under an elevated temperature for continuous work.

Step 4: Separation of Seed Substrate

Figure 3B:
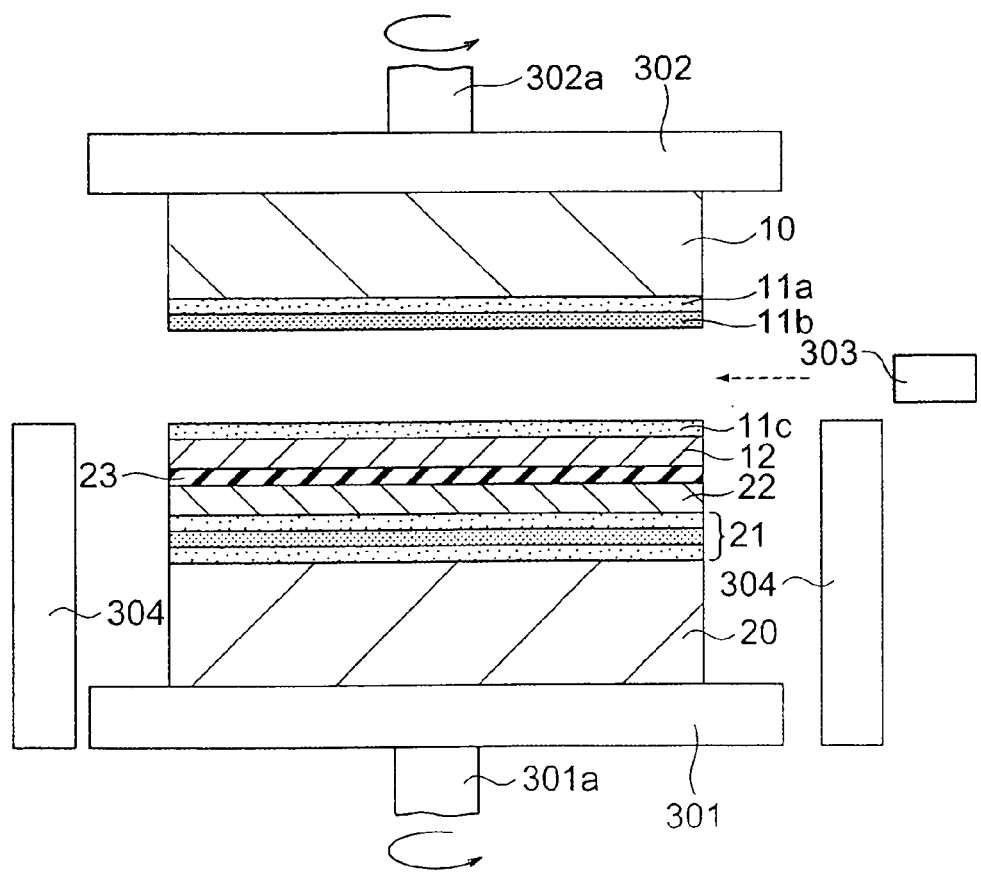

Next, as shown in a fluid high pressure jet injection peeling apparatus of FIG. 3B, the seed substrate 10 is separated at the high porous Si layer 11b by an air jet, a water jet, or the like. At this time, as previously explained, both of the porosity and the thickness of the high porous Si layer 11b are made larger than those of the high porous Si layer 21b, so the seed substrate 10 will be peeled due to the pressure action by this water jet.

In this step, the support substrate 20 side is suction clamped by a support substrate holder 301 which can rotate about a shaft 301a, the seed substrate 10 side is suction clamped by a seed substrate holder 302 which can rotate about a shaft 302a, and the support substrate holder 301 and the seed substrate holder 302 are rotated. In this state, a fluid such as an air jet or water jet is discharged from a discharging portion 303 of one or more fine nozzles toward the porous Si layer 11. At this time, to prevent the peeling action by the air jet, water jet, etc. from acting upon the high porous Si layer 21b, a stopper jig 304 (stopper portion) such as a guard ring stopper is preferably provided. The location of the high porous Si layer 21b with respect to this stopper jig 304 is finely adjusted, and the height of the support substrate holder 301 is finely adjusted so that the peeling action due to the air jet, water jet, or other fluid does not act.

By this, the pressure of the air jet, water jet, etc. can be made to act upon only the high porous Si layer 11b to separate the seed substrate 10.

As described above, the seed substrate 10 can be separated by the method of spraying a high pressure jet of a fluid such as a gas or a liquid by using one or more fine nozzles from a lateral direction to the porous Si layer while rotating or by peeling by tension. At this time, it is possible to apply ultrasonic waves to the fluid to achieve an effective peeling action.

As the fluid, there is water, an etching solution, alcohol, or another liquid or air, nitrogen, argon, or another gas. Further, there is a liquid/gas mixture obtained by mixing a gas in the liquid in an appropriate ratio. Further, if including ultra-fine powder of solid granules or powder (polishing agent, ice, pieces of plastic, etc.) in each, the peeling can be carried out with a high efficiency.

Further, the seed substrate 10 can be separated by lasering (ablation, heating, etc.) by emitting one or more laser beams from a lateral direction to the porous Si layer while rotating. As the laser beam, use can be made of a laser beam of visible light, near UV-rays, far UV-rays, near infrared rays, and far infrared rays from a carbon dioxide gas laser, a YAG laser, an excimer laser, a high harmonic modulated laser, etc.

The lasering includes the method of emitting a laser beam of a wavelength which a target object absorbs to separate it by heating or ablation and a method of focusing at least one pulse wave or continuous wave near infrared ray laser beam having a wavelength transparent with respect to the target object (Nd: YAG laser, Nd: YV04 laser, Nd: YLF laser, titanium sapphire laser, etc.) at the inside of the target object, causing an optical damage phenomenon due to multi-photon absorption to form a modified region (for example a cracked region, a melted region, a changed refractive index region, etc.), and separating it with a relatively small force using that as a start point.

In the latter-case, by focusing the laser beam at the inside of the target object (that is, the inside of the porous semiconductor layer or the ion implanted layer) by a condensing lens and gradually moving the focal point at the inside of the target object while rotating, separation becomes possible.

Particularly, in the case of the present invention, the separation layer is constituted by a porous Si layer or an ion implanted layer, so the separation by this laser beam can be carried out with a high precision and a high efficiency.

That is, a laser peeling apparatus has a similar constitution to that of the fluid high pressure jet injection peeling apparatus of FIG. 3B. The discharging portion 303 of the one or more fine nozzles corresponds to the laser output portion.

At this time, according to need, it is also possible to separate the seed substrate from the porous Si layer while cooling the counter substrate side via UV tape by a cooled support jig.

Note that the peeled off seed substrate can be reused.

Step 5: Hydrogen Annealing

Figure 4A:
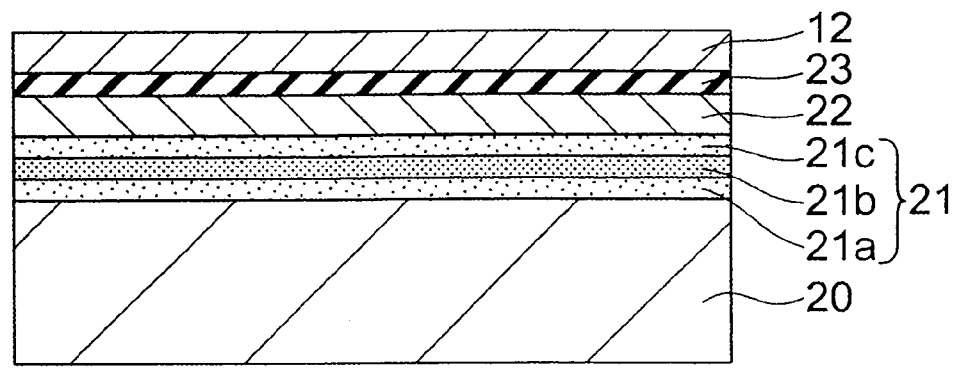
FIGS. 4A and 4B are sectional views of the state after a hydrogen annealing step in the production of a back-illuminated solid-state image pickup device according to the first embodiment.
Figure 4B:
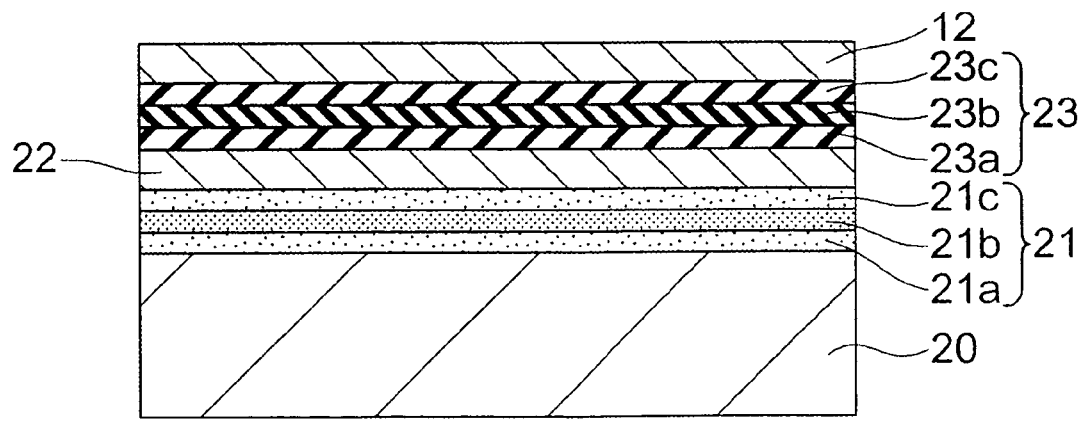

Next, the entire part of the low porous Si layer 11c remaining after the peeling and part of the surface of the first semiconductor layer 12 are etched by hydrogen annealing to form a first semiconductor layer 12 made of single crystalline Si having a thickness of for example about 5 μm having a desired thickness and flatness. FIG. 4A is a sectional view of the state after this step in a case of forming the insulating film 23 by a single layer of silicon oxide film, while FIG. 4B is a sectional view of the state after this step in a case of forming the insulating film 23 by a multilayer film of a silicon oxide film 23a, a silicon nitride film 23b, and a silicon oxide film 23c.

The hydrogen annealing etches the Si at an etching rate of 0.0013 nm/min at 1050° C. and 0.0022 nm/min at 1100° C.

Note that it is also possible if the surface of the first semiconductor layer 12 made of single crystalline Si is etched by hydrogen annealing after etching the low porous Si layer 11c remaining after the peeling by a mixture of HF, $H_2O_2$, and $H_2O$ or a mixture of HF, $HNO_3$, and $CH_3COOH$.

Step 6: Device Formation

Next, general use technology is used to form at the first semiconductor layer 12 made of single crystalline Si semiconductor devices, for example, a plurality of CCDs, CMOS sensors, or other back-illuminated solid-state image pickup sensors including photoelectric conversion portions, charge transfer portion, and charge transfer electrodes and form a plurality of bump electrodes connected to these.

Note that needless to say it is possible to form front surface illumination solid-state image pickup sensors like in the prior art and a plurality of bump electrodes connected to them.

Further, needless to say it is possible to form not only front surface illumination and back-illuminated solid-state image pickup sensors, but also MOS LSI, BipLSI, BiC-MOSLSI, or other silicon and silicon-germanium-based semiconductor devices.

Further, needless to say it is possible to form an SiC, GaAs, InP, or other compound semiconductor device by changing the seed substrate and the support substrate to compound semiconductors.

A CCD sensor is configured by an image pickup region having photodiodes for converting light to charges (electrons) arranged two-dimensionally on the Si single crystalline substrate and a circuit for transferring and outputting the charges.

According to the configuration of the transfer portion, there are an inter-line (IL) system and a frame transfer (FT) system.

The inter-line (IL) system transfers the charges obtained by the photodiodes vertically by each stage by a vertical transfer line located on the side of the photo sensor, sends them as a serial charge train by horizontal registers to the output portion, and amplifies them to a signal voltage.

The frame transfer (FT) system transfers the charges at a high speed to a storage portion, outputs them as a serial charge train by horizontal registers, and amplifies them to a signal voltage.

Further, the photodiodes generally are arranged in a square lattice, but so-called honeycomb lattice arrays of octagonal light receiving elements arranged in a zigzag manner are also commercially available.

Here, concretely, when forming an inter-line (IL) system CCD sensor, the photodiodes are formed in a matrix in the horizontal direction and the vertical direction, vertical transfer registers made of CCDs commonly connected to the photodiodes aligned in the vertical direction are formed, and horizontal transfer registers made of CCDs commonly connected to the vertical transfer registers are formed. Further, the output portion is provided in the transfer stage of the horizontal transfer registers.

A CCD sensor transfers electrons converted by the photodiodes to the output portion by the vertical transfer registers and the horizontal transfer registers and amplifies the electrons to the signal voltage.

A CMOS sensor utilizes characteristics such as a low power consumption and single power supply and is attracting attention as a video input device of a mobile phone or other mobile device.

A CMOS sensor is produced using a CMOS process basically the same as a memory, a logic LSI, etc.

When forming a CMOS sensor, a unit pixel is formed by a combination of a photodiode and a switch element comprised of an MOS transistor, a plurality of unit pixels are arranged in a matrix, and horizontal and vertical shift registers connected to the pixels are formed. In the CMOS sensor, by sequential switching by pulses applied from the shift registers, the signal charges of the pixels are extracted to the output.

Figure 5:
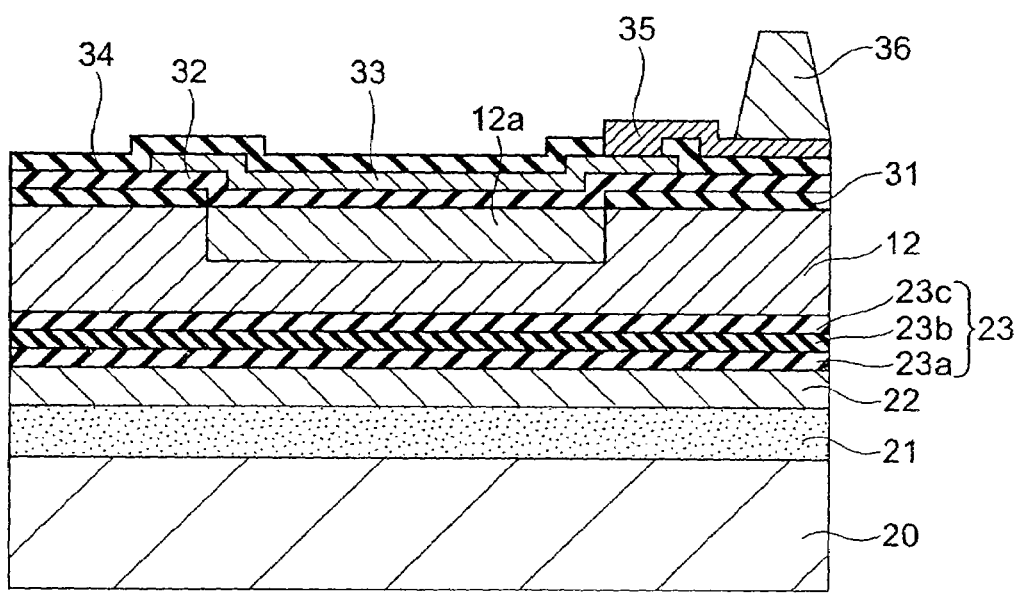
FIG. 5 is a sectional view of the state after formation of a device in the production of a back-illuminated solid-state image pickup device according to the first embodiment.

FIG. 5 shows an example of the case of a CCD. An n-type impurity is introduced by ion implantation into a first semiconductor layer 12 made of p-type single crystalline Si separated into element formation regions isolated by an element isolation insulating film 31 such as a field oxide film to form a not illustrated photodiode or buried transfer channel region 12a and is activated at 750° C. for 30 minutes. Note that, other than this, a p-type impurity etc. are introduced to form channel stopper.

Then, this buried transfer channel region 12a is formed with a gate insulating film 32 made of silicon oxide and a transfer electrode 33 made of poly-silicon and is formed with an inter-layer insulating film 34 made of silicon oxide. Note that the above transfer register is constituted by the buried transfer channel region 12a and the transfer electrode 33.

Then, part of this inter-layer insulating film 34 is formed with a contact hole, an electrode takeout terminal 35 made of a metal such as aluminum or an aluminum-silicon alloy electrically contacting the transfer electrode 33 is formed around the chip or inside the chip and around the chip, and a projecting bump electrode 36 to be connected to the electrode takeout terminal 35 is formed.

The bump electrode 36 may be a peripheral bump on the periphery of the chip, an internal bump inside the chip, or mixed type bump. The bump may be any of a bump mainly formed by plating or a stud bump of an Au wire etc., but in the latter case, care should be taken so as not to damage not only the first semiconductor layer 12, but also the base second semiconductor layer 22 and the porous Si layer 21 due to the shock of the wire bonding. Note that the height may be freely selected within a range of from 10 to 100 μm.

As the method for forming a solder bump, a well known method of formation such as the super "jaffit" method, super solder method, or beam solder PC method can be employed.

Here, the super "jaffit" method is a method for example forming a barrier metal layer made of a multilayer film of Cr and Cu on only an Al pad, treating the surface by a chemical agent to form a sticky coating film, and bringing this sticky coating film into contact with solder powder to make the solder powder stick to the surface of the barrier metal layer and heat treating this to form a solder bump. A bump made of an Sn—Ag-based or Sn—Zn-based solder free from lead is thereby formed.

The super solder method is a method forming solder in a paste by a reaction of an organic acid lead and an organic acid tin not including solder powder in the system and causing it to precipitate on the copper of the surface of the barrier metal layer in the same way as the above to form a solder bump. A bump made of the Sn—Pb-based solder is thereby formed.

The beam solder PC method is a method using a substitution reaction by a galvanic battery comprised of underlying copper and tin and lead to cause tin and lead to precipitate on the copper surface and form a coating film and forming a solder bump by electroplating from this. A bump made of a Sn—Pb-based solder is thereby formed.

As described above, a CCD or CMOS configuration solid-state image pickup sensor unit is formed. The desired potential for driving the charge transfer etc. of the solid-state image pickup sensor unit is given by forming a bump electrode 36 via an electrode takeout portion 35 made of aluminum, an aluminum-silicon alloy, or the like connected to this transfer electrode etc.

Step 7: Formation of Score and Protective Film

Figure 6A:
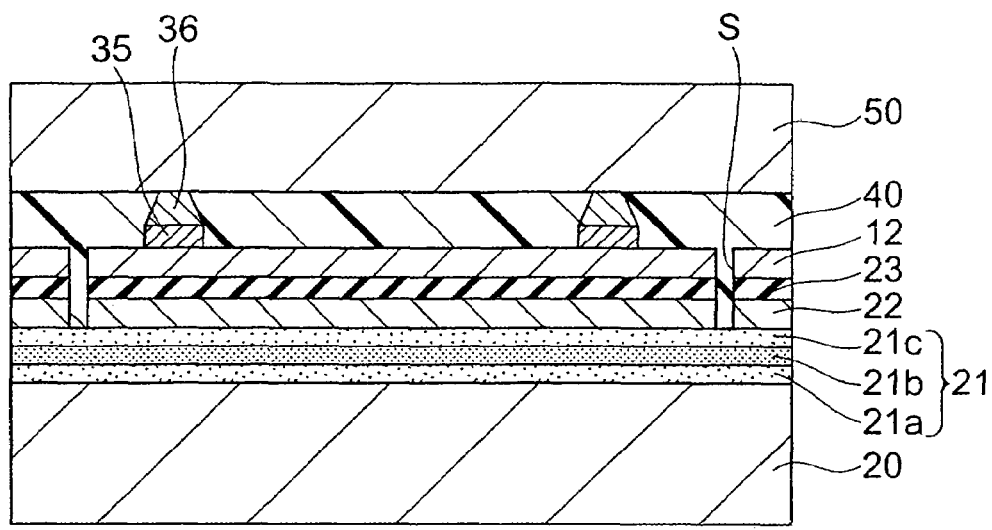
FIGS. 6A and 6B are sectional views of the state after forming a score and a resin protective film and separating a support substrate in the production of a back-illuminated solid-state image pickup device according to the first embodiment.

Next, as shown in FIG. 6A, a score S is formed by blade dicing along a scheduled pellet division border line in a scribe line from the first semiconductor layer 12 side to penetrate through at least the second semiconductor layer 22 made of single crystalline Si, then a transfer mold process, an injection molding process, an extrusion process, an insert molding process, a compression molding process, a spin coating process, or the like is used to seal the interior of the score S and the first semiconductor layer 12 surface by an epoxy resin, a polyimide resin, a phenol resin, an epoxy acrylate resin, an acrylic resin, a silicone resin, a polyimide silicone resin, an unsaturated polyester resin, or other heat curing resin, or a liquid crystal polymer, a polyphenylene sulfide resin, a polysulfone resin, or other heat resistant thermoplastic resin or other transparent, semi-transparent, or opaque resin protective film 40. The film is cured afterward in accordance with the molding process and resin characteristics.

Next, the resin protective film 40 is polished on one surface by optical polishing, chemical mechanical polishing (CMP), etc. to expose the bump electrode 36. In accordance with need, the surface of the bump electrode 36 is flash plated with gold and the surface is protected by protective tape 50.

As the protective tape 50, a conductive UV curing adhesive and tape which are transparent and free from residual adhesive are desirable for preventing static electricity damage.

Note that this transparent, semi-transparent, or opaque resin protective film 40 must be a high purity product not generating $\alpha$-rays for preventing deterioration of the image quality.

Step 8: Separation of Support Substrate

Figure 6B:
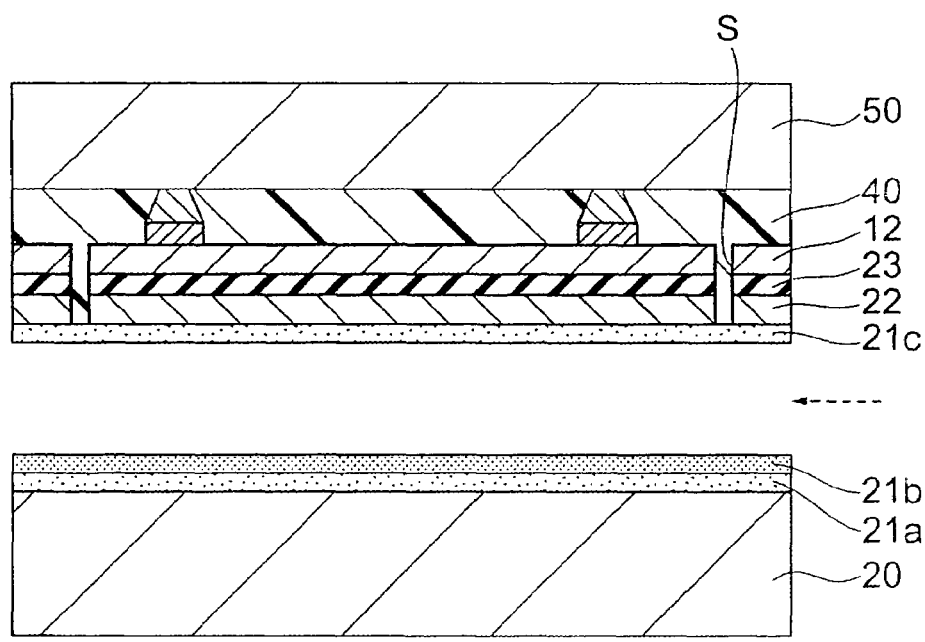

Next, as shown in FIG. 6B, the support substrate 20 is separated at the high porous Si layer 21*b* by an air jet, water jet, or the like. At this time, the score S reaching the porous Si layer 21 is filled by the resin protective film 40. Strain due to curing shrinkage stress of this resin protective film 40 made of an epoxy-based resin or the like is also added. As a result, the efficiency of separation of the support substrate 20 at the high porous Si layer 21*b* by the water jet or the like from the lateral side becomes better. For this reason, mechanical shock etc. to the device already formed at the first semiconductor layer 12 can be reduced.

Note that at this time as well, it is preferable to use a ring stopper jig to protect the resin protective film 40 including the first semiconductor layer 12 from the lateral direction pressure of the air jet or the water jet.

Further, the support substrate can be separated by the method of spraying a jet of a high pressure fluid such as a gas or a liquid to the porous Si layer while rotating from the lateral direction using one or more fine nozzles or by peeling by tension. At this time, if applying ultrasonic waves to the fluid, a more effective action can be expected.

As the fluid, there are water, an etching solution, alcohol, or another liquid and air, nitrogen, argon, or another gas. Further, there is a liquid/gas mixture obtained by mixing a gas in a liquid at an appropriate ratio. Further, if including ultra-fine powder of solid granules or powder (polishing agent, ice, pieces of plastic, etc.) in each, the peeling can be carried out with a high efficiency.

Further, the support substrate can be separated by laser (ablation, heating, etc.) by emitting one or more laser beams from a lateral direction to the porous Si layer while rotating. As the laser beam, use can be made of a laser beam of visible light, near UV-rays, far UV-rays, near infrared rays, and far infrared rays from a carbon dioxide gas laser, a YAG laser, an excimer laser, a high harmonic modulated laser, etc.

The lasering includes the method of emitting a laser beam of a wavelength which a target object absorbs to separate it by heating or ablation and a method of focusing at least one pulse wave or continuous wave near infrared ray laser beam having a wavelength transparent with respect to the target object (Nd: YAG laser, Nd: YV04 laser, Nd: YLF laser, titanium sapphire laser, etc.) at the inside of the target object, causing an optical damage phenomenon due to multi-photon absorption to form a modified region (for example a cracked region, a melted region, a changed refractive index region, etc.), and separating it with a relatively small force using that as a start point.

In the latter case, by focusing the laser beam at the inside of the target object (that is, the inside of the porous semiconductor layer or the ion implanted layer) by a condensing lens and gradually moving the focal point at the inside of the target object while rotating, separation becomes possible.

Particularly, in the case of the present invention, the separation layer is constituted by a porous Si layer or an ion implanted layer, so the separation by this laser beam can be carried out with a high precision and a high efficiency.

That is, a laser peeling apparatus has a similar constitution to that of the fluid high pressure jet injection peeling apparatus of FIG. 3B. The discharging portion 303 of the one or more fine nozzles corresponds to the laser output portion.

At this time, according to need, it is also possible to separate the support substrate at the porous Si layer while cooling the counter substrate side via UV tape by a cooled support jig.

Note that the support substrate can be reused.

Step 9: Preparation of Back-Illuminated Solid-State Image Pickup Device Chip

Next, the resin protective film 40 made of the epoxy-based resin or the like filled in the score S is full cut diced from the second semiconductor layer 22 side. Then, the remainder of the low porous Si layer 21*c* and the second semiconductor layer 22 are etched. According to need, the insulating film 23 is also etched to obtain a single-surface resin sealing type ultra-thin back-illuminated solid-state image pickup device chip. This step will be explained in detail below.

Figure 7A:
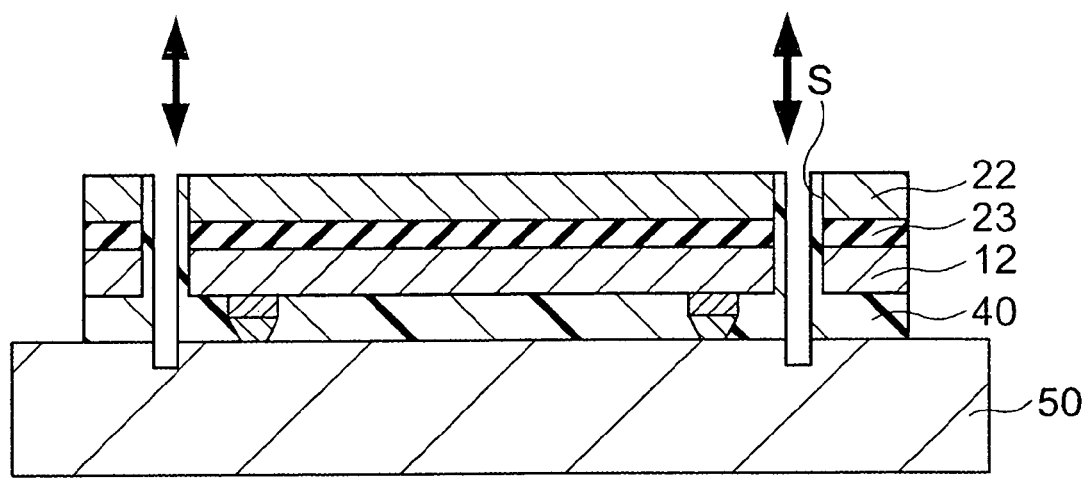
FIGS. 7A and 7B are sectional views of the state after full dicing in the production of a back-illuminated solid-state image pickup device according to the first embodiment.
Figure 7B:
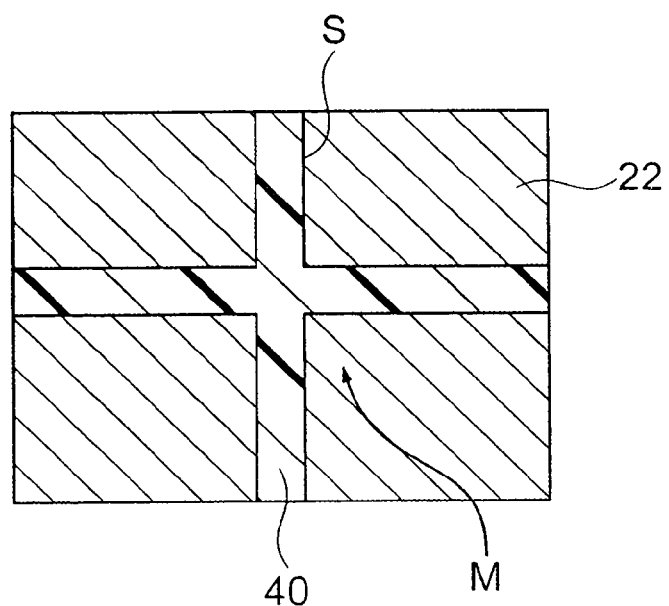

First, as shown in FIG. 7B, using a cross alignment mark M constituted by the resin protective film 40 made of the epoxy-based resin or the like filled in the score S formed in the second semiconductor layer 22 and exposed from the surface of the second semiconductor layer 22 as a reference, full cut dicing is carried out along the exposed resin protective film 40. At this time, the depth of cut of the protective tape 50 is made about 20 to 30 µm. FIG. 7A is a sectional view of the state after this full cut dicing.

In the full cut dicing, a dicing blade thinner than that at the time of forming the score S formed in the previous step shown in FIG. 6A is used to dice the center of the exposed resin protective film to leave the resin protective film 40 at the chip side surfaces.

Note that when desiring to enlarge the air gap and there is a restriction in the acid resistance of the resin protective film, use is made of a dicing blade thicker than that at the time of formation of the score S formed in the previous step shown in FIG. 6A to dice the schematic center of the exposed resin protective film to leave the resin protective film 40 at the chip side surfaces.

Note that it is also possible to dice and separate selectively using blade dicing, laser cutting (carbon dioxide gas laser, YAG laser, excimer laser, or the like), a diamond cutter, a cemented carbide cutter, an ultrasonic wave cutter, or the like in accordance with the material of the object.

Figure 8A:
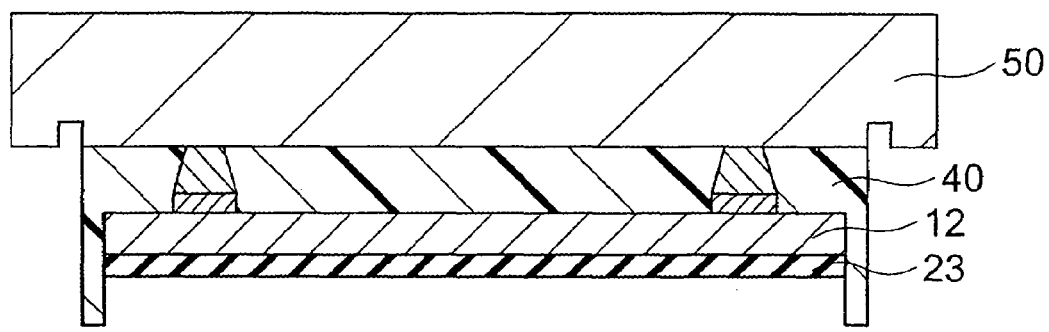
FIGS. 8A and 8B are sectional views of the state after fabrication of a back-illuminated solid-state image pickup device chip in the production of a back-illuminated solid-state image pickup device according to the first embodiment.

Next, as shown in FIG. 8A, the remainder of the low porous Si layer 21*c* and the second semiconductor layer 22 are etched by an $HF+H_2O_2+H_2O$ liquid mixture, $HF+HNO_3+CH_3COOH$ liquid mixture, or the like. Note that when forming the insulating film 23 by a single layer of silicon oxide film, it is also possible to consecutively etch the silicon oxide film by a fluoric acid+ammonium fluoride liquid mixture according to need.

Figure 8B:
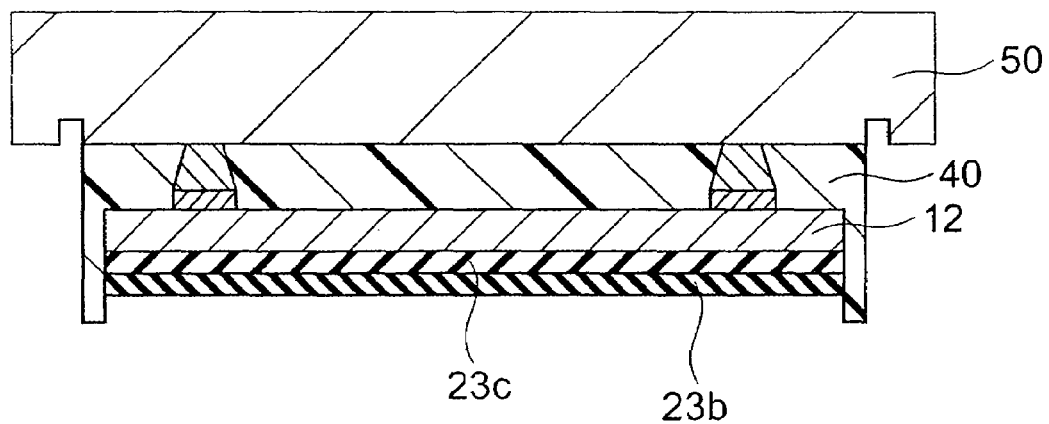

Alternatively, as shown in FIG. 8B, when forming the insulating film 23 by a multilayer film of a silicon oxide film 23a, a silicon nitride film 23b, and a silicon oxide film 23c, it is also possible to consecutively etch the silicon oxide film 23a by a fluoric acid+ammonium fluoride liquid mixture according to need to form a multilayer film of a silicon oxide film 23c and a silicon nitride film 23b.

Note that, at this time, preferably use is made of a resin protective film 40 and a protective tape 50 made of an acid resistant epoxy-based resin resistant to the fluoric acid-based etching solution for etching the second semiconductor layer 22 made of the exposed single crystalline Si.

Step 10: Fixing of Transparent Substrate

Figure 9A:
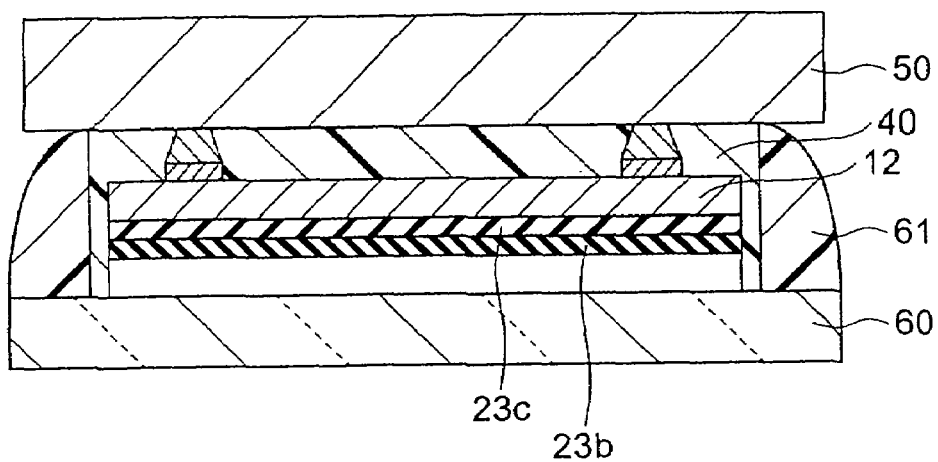
FIGS. 9A and 9B are sectional views of the state after affixing a transparent substrate and mounting to a mounting board in the production of a back-illuminated solid-state image pickup device according to the first embodiment.

Next, as shown in FIG. 9A, using a step difference between the resin protective film 40 at the side surfaces of the back-illuminated solid-state image pickup device chip and the insulating film 23b of the back of the chip as an air gap, a transparent substrate 60 is affixed by a sealing agent 61, the back of the chip is air-tightly sealed by the transparent substrate 60 and the sealing agent 61, then the protective tape 50 is peeled off to fabricate a back-illuminated solid-state image pickup device of a single-surface resin sealed ultra-thin chip size hollow package.

Note that when there is no step difference between the resin protective film 40 and the insulating film 23b of the back of the chip and the air gap cannot be obtained, the entire peripheral portion of the back of the chip is coated with a sealing agent 61 containing spacers of a size corresponding to the desired air gap in an amount of 10 to 30% by weight and is air-tightly sealed by the transparent substrate 60.

As the transparent substrate 60, for preventing deterioration of the image quality, a seal glass free from generating α-rays, a humidity resistant transparent film, or the like is employed.

Further, the sealing agent 61 may be any of a low temperature heat curable adhesive, a UV curable adhesive, or a UV curable and low temperature heat curable adhesive, but must be a material not generating α-rays and having a high humidity resistance.

Step 11: Mounting onto Mounting Board

Figure 9B:
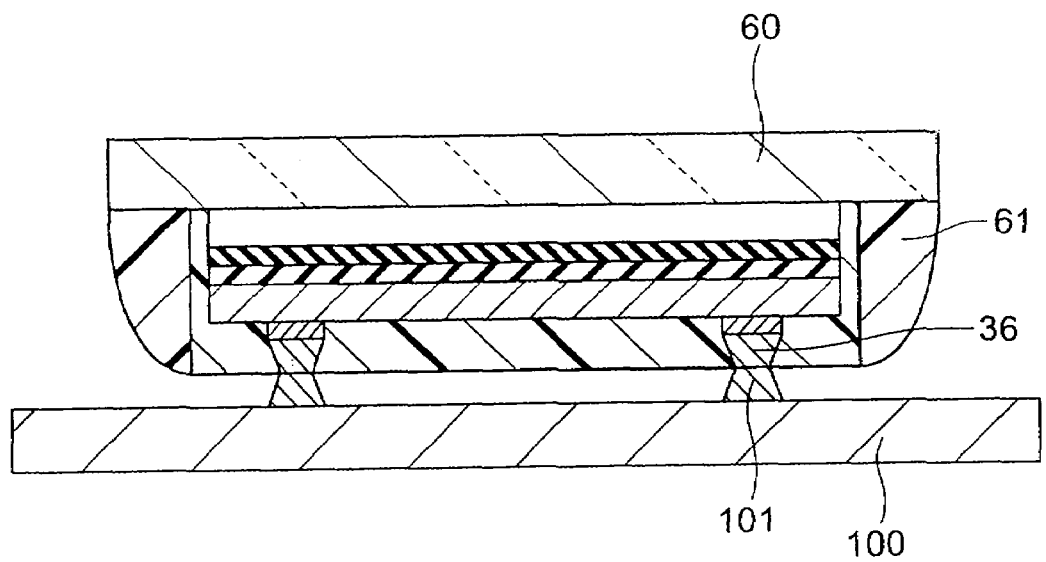

Next, as shown in FIG. 9B, a silver paste, solder paste, or other conductive paste 101 is used to mount the chip size hollow package fabricated in the previous step on a printed circuit board (PCB) 100 made of a glass epoxy substrate, a flexible printed circuit board, or the like.

At this time, until immediately before mounting onto the printed circuit board 100, the chip is protected at its surface and held by the protective tape 50 of the conductive adhesive having a strong adhesive force and free from residual adhesive and the bump electrodes are short circuited, so static electricity damage is prevented, bump connection failure is prevented, and further chip breakage, chipping, and cracking are prevented, so the yield, quality, and the reliability are improved.

A back-illuminated solid-state image pickup device of a single-surface resin sealed ultra-thin chip size hollow package according to the present embodiment is produced as described above.

According to the method of production of a back-illuminated solid-state image pickup device according to the present embodiment described above, by forming an SOI substrate comprised of a support substrate 20 on which a porous Si layer 21, a second semiconductor layer 22 constituted by a single crystalline Si layer, an insulating film 23, and a first semiconductor layer 12 constituted by a single crystalline Si layer are stacked, forming a score S up to a layer above the desired separation portion in advance, that is, up to the second semiconductor layer 22 and the porous Si layer 21, and sealing the surface of the first semiconductor layer 12 and the interior of the score S by a resin protective film 40, due also to the strain due to the curing shrinkage stress of the resin protective film 40 made of the epoxy-based resin or the like, the efficiency of separating the support substrate 20 from the porous Si layer 21 by a water jet, air jet, or the like from the lateral direction is good and the yield, quality, and productivity can be improved.

Further, since the solid-state image pickup device is chip can be held while protecting its surface by a protective tape 50 made of a conductive adhesive having a strong adhesive force and free from residual adhesive until immediately before mounting onto a printed circuit board 100, static electricity damage is prevented, bump connection failure is prevented, and further chip breakage, chipping, and cracking are prevented, so the yield, quality, and the reliability are improved.

Further, by inserting as the insulating film 23 between the first semiconductor layer 12 and the second semiconductor layer 22 for forming the CCD portion or CMOS sensor unit including the photoelectric conversion portion, the charge transfer portion, and the charge transfer electrodes and the bump electrodes etc. not only a single layer of silicon oxide, but also a nitride-based silicon film having an appropriate thickness using a silicon oxynitride film or a multilayer film of a silicon oxide film 23a, silicon nitride film 23b, and silicon oxide film 23c, the yield and the quality are further improved.

Namely, contamination by a halogen element (Na ions etc.) from the support substrate 20 side at the time of the packaging and during the device process can be prevented.

Further, the insulating film can reduce or prevent the warping and strain of the first semiconductor layer 12 due to expansion at oxidation of the porous Si layer 21 during the device process.

Further, at the time of etching away the second semiconductor layer 22 made of the single crystalline Si layer and the porous Si layer 21, it acts as an etching stopper, so a high precision sensor unit can be fabricated and a high sensitivity and high precision solid-state image pickup device can be obtained.

Further, since it is a high performance insulating film, there is a little leakage current, a good low noise characteristic is obtained, and further use as an anti-reflection film is possible.

Further, by full cut dicing the resin protective film 40 made of the epoxy-based resin or the like filled in the score S from the back to obtain a chip size hollow package sealed by a transparent substrate 60 such as sealing glass via an air gap formed by the height of the resin protective film 40 remaining on the chip side surface and the chip back, a back-illuminated solid-state image pickup device of an extremely thin single-surface resin sealed chip size hollow package is obtained.

Second Embodiment

In the present embodiment, the explanation will be given of a method of production and production apparatus of a back-illuminated solid-state image pickup device of a single-surface resin sealed ultra-thin chip size hollow package using the double ion implanted layer separation method (the method of separating a seed substrate by a first ion implanted layer formed by implanting for example hydrogen atoms in the seed substrate and separating the support substrate by a second ion implanted layer formed by implanting for example hydrogen in the support substrate) among the methods of fabrication of new ultra-thin SOI substrates.

Step 1: Formation of Hydrogen Ion Implanted Layer

Figure 10A:
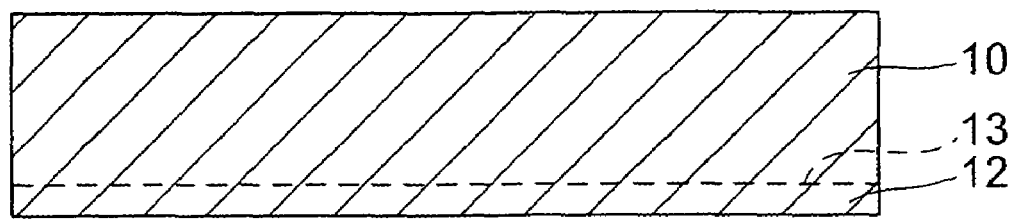
FIGS. 10A to 10C are sectional views of the state after formation of a hydrogen ion implanted layer and an insulating film in the production of a back-illuminated solid-state image pickup device according to a second embodiment.

First, as shown in FIG. 10A, a seed substrate 10 made of p-type Si single crystal of 8 inch diameter and 800 μm thickness (resistivity of 0.01 to 0.02 Ωcm) is implanted with hydrogen ions to form an ion implanted layer 13. The depth of this ion implanted layer 13 from the seed substrate 10 is obtained by taking the thickness of the first semiconductor layer 12 which will form the solid-state image pickup device from the surface of the seed substrate 10 into account. For example, the hydrogen ions are implanted with a power of 500 KeV and a dosage of $5 \times 10^{16}$ to $1 \times 10^{17}/cm^2$ at a location of a depth of about 5 μm. Note that the ions implanted can also be nitrogen, helium, or another dilution gas other than hydrogen.

Step 2: Formation of Insulating Film

A support substrate 20 made of p-type Si single crystal of 8 inch diameter and 800 μm thickness (resistivity is 0.01 to 0.02 Ωcm) is formed with an insulating film 23 made of silicon oxide or the like having a thickness of for example about 200 to 300 nm.

Figure 10B:
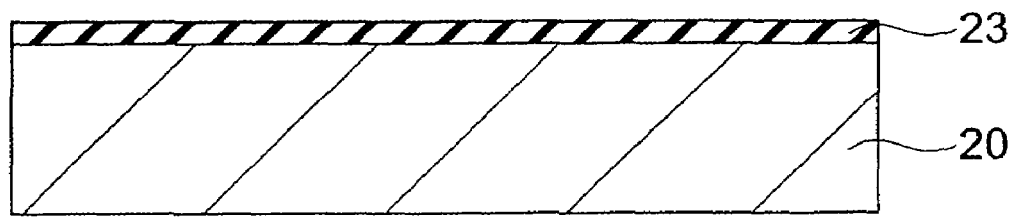
Figure 10C:
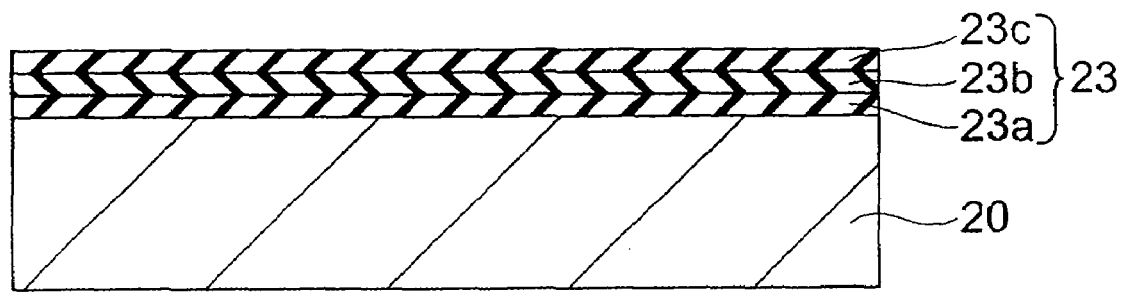

Note that this insulating film 23 may be a single layer of silicon oxide as shown in FIG. 10B similar to the first embodiment, but may also be made a multilayer film of a silicon oxide film 23a, silicon nitride film 23b, and silicon oxide film 23c as shown in FIG. 10C obtained by using reduced pressure CVD to form a silicon nitride film on the support substrate 20 and thermally oxidizing it. In this case, for example, the thickness of the silicon oxide film 23a is set to about 200 nm, the thickness of the silicon nitride film is set to about 50 nm, and the thickness of the silicon oxide film 23c is set to about 200 nm.

The advantages in particular of the presence of a silicon nitride film having a appropriate thickness in this way are similar to those explained in the first embodiment.

Step 3: Bonding

Figure 11A:
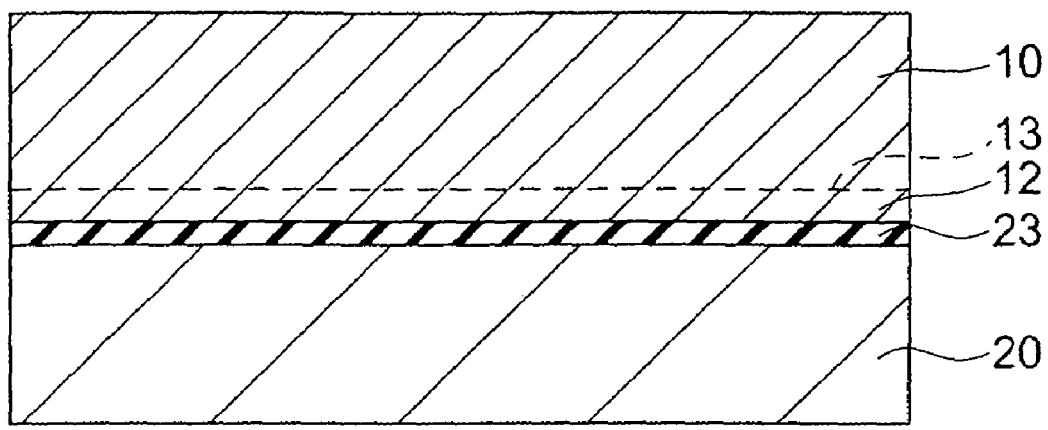
FIGS. 11A and 11B are sectional views of the state after bonding the substrates in the production of a back-illuminated solid-state image pickup device according to the second embodiment.
Figure 11B:
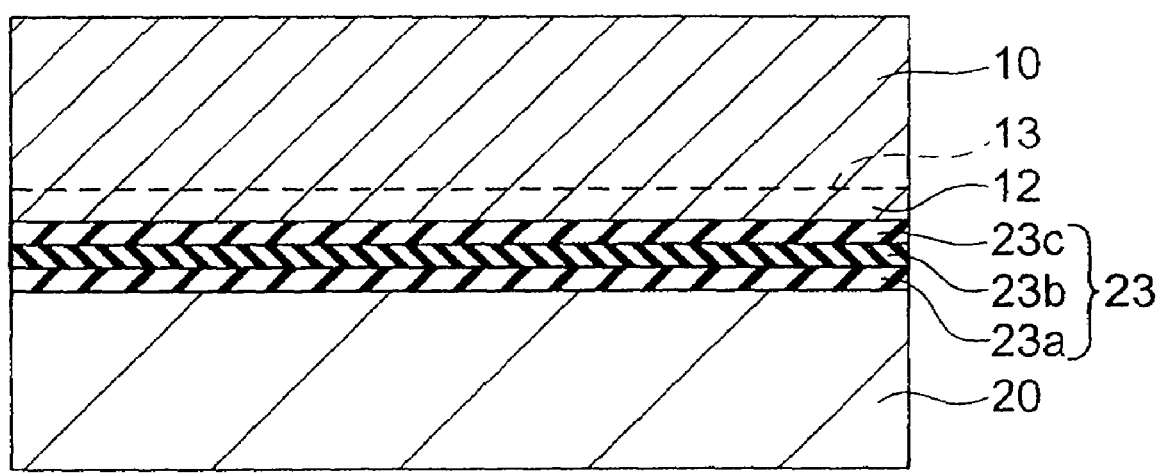

Next, in the same way as the first embodiment, the insulating film 23 surface of this support substrate 20 and the surface of the seed substrate 10 are washed, then the substrates are brought into contact with each other from the insulating film 23 side of the support substrate 20 and the first semiconductor layer 12 side of the seed substrate 10 at room temperature and made to bond by Van der Waals force. Next, they are heat treated to cause covalent bonding to thereby strengthen the bonding. FIG. 11A is a sectional view of the state after the bonding in the case where the insulating film 23 is a single layer of silicon oxide; while FIG. 11B is a sectional view of the state after bonding in the case where the insulating film 23 is a multilayer film of a silicon oxide film 23a, silicon nitride film 23b, and silicon oxide film 23c.

At this time, it is confirmed if there is any deposition of dust or dirt on the surfaces of the two substrates 10 and 20. If there is any foreign matter, it is peeled and washed away.

Further, the heat treatment is preferably carried out in nitrogen or an inert gas or a mixed gas of nitrogen and an inert gas. For example, by setting the heat treatment temperature at 400° C. and performing the treatment for 30 minutes, the bond can be made stronger.

Further, it is also possible to set two superimposed substrates in a reduced pressure heat treatment furnace and hold them at a predetermined pressure (for example 133 Pa or less) by evacuation, bring them into close contact by application of pressure at the time of breaking to atmospheric pressure after a predetermined time, then heat the two in nitrogen or an inert gas or the mixed gas of nitrogen and an inert gas under an elevated temperature for continuous work.

Step 4: Separation of Seed Substrate

Figure 12:
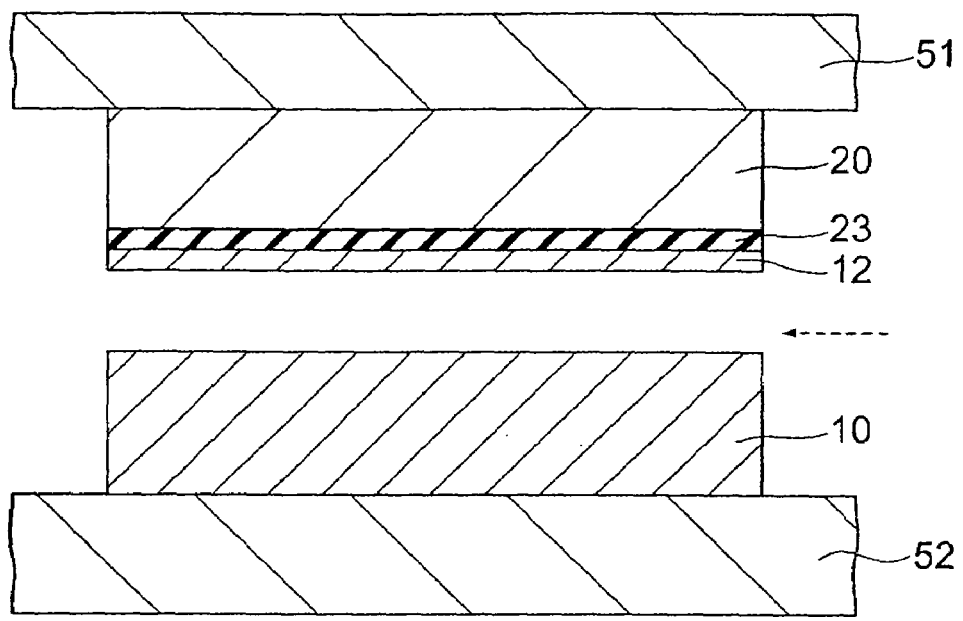
FIG. 12 is a sectional view of the state after separation of a seed substrate in the production of a back-illuminated solid-state image pickup device according to the second embodiment.

Next, as shown in FIG. 12, for example, by peeling use annealing by heating at 500° C. for 10 to 20 minutes or rapid heating and rapid cooling (at about 800° C. for few seconds by a halogen lamp or at about 1000° C. for few milliseconds by an Xe flash lamp), strain is caused in the ion implanted layer 13 by the pressure action in the hydrogen micro bubbles present in the ion implanted layer 13 and the crystal re-alignment action, the backs of the substrates 10 and 20 are bonded to each other by UV tapes 51 and 52, and substrates are peeled by tension. Then, the result is UV cured and the UV tapes 51 and 52 are peeled off.

Note that, the peeled off seed substrate can be reused. Note that, in the same way as the above, it is also possible to separate this from the ion implanted layer by lasering.

Step 5: Hydrogen Annealing

In the same way as the first embodiment, after peeling off the seed substrate 10, part of the surface of the first semiconductor layer 12 made of the single crystalline Si layer is etched by hydrogen annealing to form a first semiconductor layer 12 made of a single crystalline Si layer having a desired thickness, for example, 5 μm, and flatness. The hydrogen annealing etches the Si at an etching rate of 0.0013 nm/min at 1050° C. or at an etching rate of 0.0022 nm/min at 1100° C.

Step 6: Device Formation

General use technology is used to form in the first semiconductor layer 12 a CCD, CMOS sensor, or other back-illuminated solid-state image pickup sensor unit including a photoelectric conversion portion, charge transfer portion, and charge transfer electrodes. After a heat treatment step at 500° C. or more, for example hydrogen ions are implanted to a high concentration at a location in the insulating film 23 of a depth of 8 to 10 μm from the surface of the first semiconductor layer 12, that is, a depth of 3 to 5 μm of the support substrate 20, then peeling use annealing is performed to cause strain. Thereafter, aluminum interconnects and a plurality of bump electrodes connected to them are formed. The CCD sensor and the CMOS sensor are similar to those explained in the first embodiment.

Figure 13:
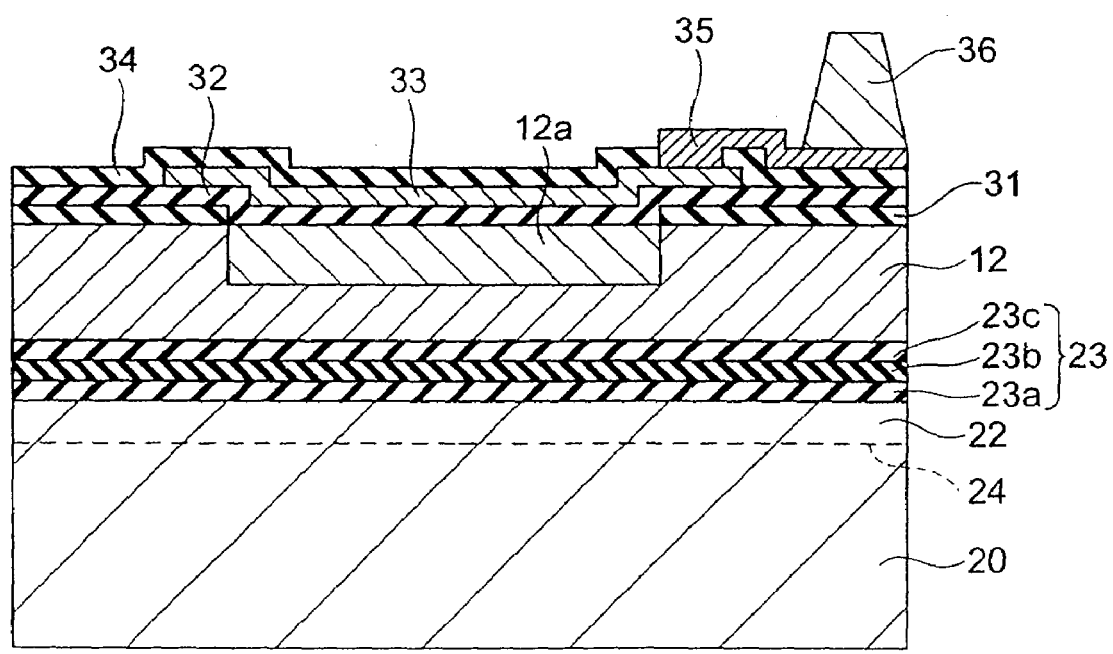
FIG. 13 is a sectional view of the state after formation of a device in the production of a back-illuminated solid-state image pickup device according to the second embodiment.

FIG. 13 shows an example of the case of a CCD. Ions of the n-type impurity phosphorus are implanted into each element formation region of the first semiconductor layer 12 made of the p-type single crystalline Si on which regions are isolation by insulation by a field oxide film or other element isolation insulating film 31 so as to form a buried transfer channel region 12a. This is ion activated at 750° C. for 30 minutes. Note that other than this, the p-type impurity is introduced to form a channel stopper.

Then, this buried transfer channel region 12a is formed with a gate insulating film 32 made of silicon oxide and a transfer electrode 33 made of polycrystalline silicon by CVD or the like to form an inter-layer insulating film 34 made of silicon oxide. Note that a transfer register of the CCD is constituted by the buried transfer channel region 12a and the transfer electrode 33.

For example hydrogen ions are implanted with a high concentration to a depth of 8 to 10 μm from the surface after the heat treatment step of 500° C. or more to form an ion implanted layer 24, then peeling use annealing is carried out to cause strain. Note that the ion implantation can also be carried out by nitrogen, helium, or another dilution gas other than hydrogen.

The depth of the ion implanted layer 24 from the bonding interface between the support substrate 20 and the insulating film 23 is set taking into account the thickness of the second semiconductor layer 22 to be formed. For example, the hydrogen ions are implanted with a power of about 1000 KeV and a dosage of $5\times10^{16}$ to $1\times10^{17}/cm^2$ at a location of a depth of 8 to 10 μm.

As the peeling use annealing, heat treatment at 500° C. for 10 to 20 minutes in the same way as the above or rapid heating and rapid cooling (800° C. for few seconds by a halogen lamp or at about 1000° C. for few milliseconds by an Xe flash lamp) is employed. By this, strain is caused in the ion implanted layer 24 by the pressure action in the hydrogen micro bubbles present in the ion implanted layer 24 and the crystal realignment action.

At this time, there are the first semiconductor layer 12 made of the single crystalline Si layer, the silicon oxide film, the silicon nitride film, the polycrystalline silicon film, and other device forming films. The ion implanted layer 24 is formed penetrating through them under the insulating film 23 and strain is caused by heat treatment.

Simultaneously, by this peeling use annealing, by the activation action of the implanted ions remaining in the first semiconductor layer 12 made of the single crystalline Si layer, the silicon oxide film, the silicon nitride film, the polycrystalline silicon film, and other device forming films, reduction of crystal defects in the first semiconductor layer and improvement of the interface states of the first semiconductor layer and device forming films can be expected.

Next, a contact hole is formed in part of the inter-layer insulating film 34, an electrode takeout terminal 35 made of aluminum, an aluminum-silicon alloy, or other metal electrically contacting the transfer electrode 33 is formed around the chip or inside the chip and around the chip, and a projecting bump electrode 36 to be connected to the electrode takeout terminal 35 is formed.

The bump may be any of a bump mainly formed by plating or a stud bump of an Au wire etc., but in the latter case, care should be taken so as not to damage not only the first semiconductor layer 12, but also the base second semiconductor layer 22 due to the shock of the wire bonding. Note that the height may be freely selected within a range of from 10 to 100 μm.

Step 7: Formation of Score and Protective Film

Figure 14A:
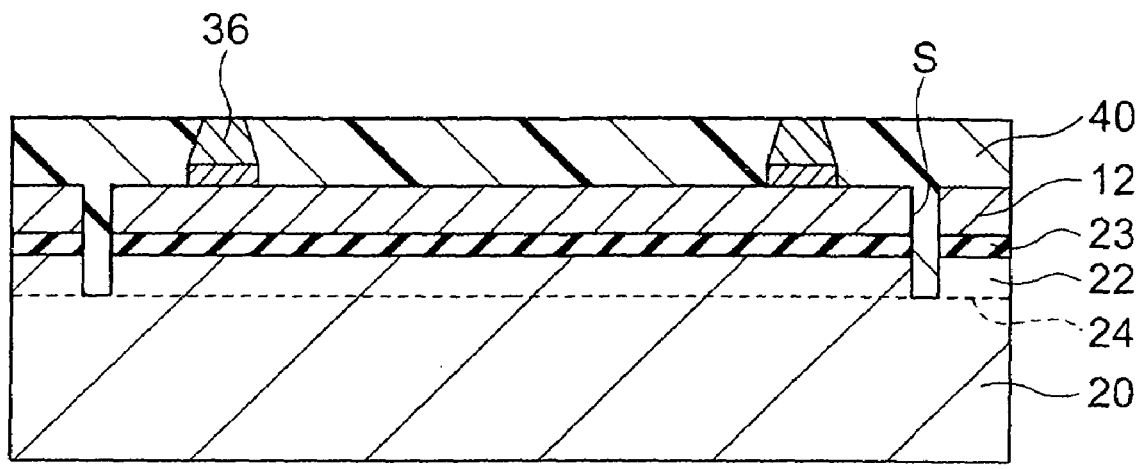
FIGS. 14A and 14B are sectional views of the state after forming a score and a resin protective film and separating a support substrate in the production of a back-illuminated solid-state image pickup device according to the second embodiment.

Next, as shown in FIG. 14A, in the same way as the first embodiment, a score S is formed by dicing along a scheduled pellet division border line in a scribe line from the first semiconductor layer 12 side to reach at least the ion implanted layer 24, then a transfer mold process, a spin coating process, or the like is used to fill the score S and seal the surface of the first semiconductor layer 12 by an epoxy resin. Optical polishing, chemical mechanical polishing (CMP), or other polishing on one surface is used to form a resin protective film 40 exposing the bump electrode 36. The surface of the exposed bump electrode 36 is Au flash plated according to need.

Step 8: Separation of Support Substrate

Figure 14B:
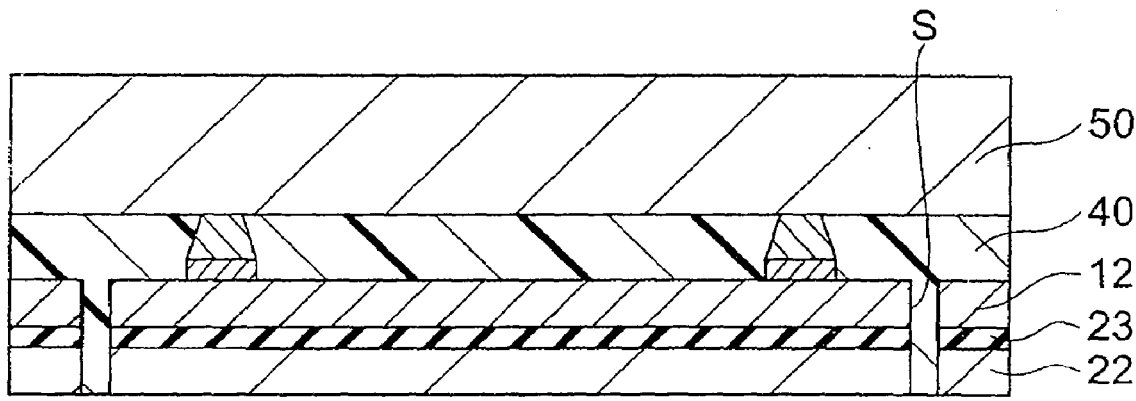
Figure 14B:
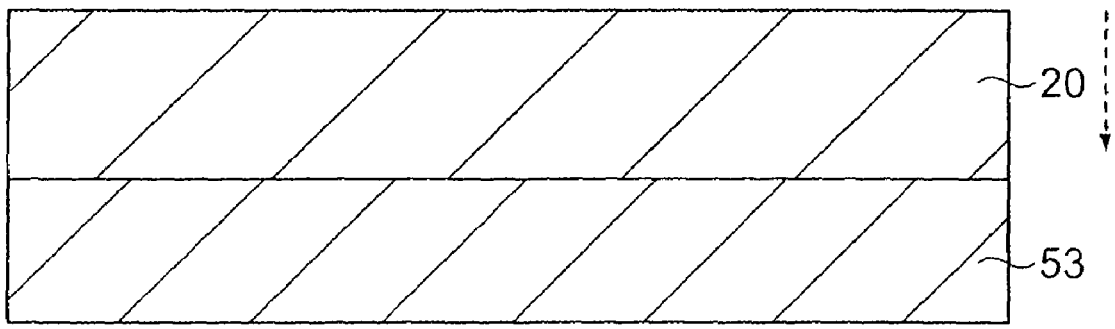

Next, as shown in FIG. 14B, protective tape 50 made of UV tape or the like is bonded to the resin protective film 40 side, UV tape 53 is bonded to the facing support substrate 20 side, and the support substrate 20 is peeled by tension from the ion implanted layer 24. For the protective tape 50 and the UV tape 53, desirably use is made of a transparent, residual adhesive free conductive type UV curing adhesive for preventing static electricity damage.

At this time, the score S reaching the ion implanted layer 24 is filled with the resin protective film 40. Strain is also applied due to the curing shrinkage stress of the resin protective film 40 made of the epoxy-based resin or the like.

As a result, the efficiency of peeling by tension of the support substrate 20 due to the strain of the ion implanted layer 24 becomes better. For this reason, mechanical shock etc. to the device already formed at the first semiconductor layer 12 can be reduced.

Note that the support substrate can be reused. Note that it is also possible to separate it from the ion implanted layer by lasering in the same way as above.

Step 9: Fabrication of Back-Illuminated Solid-State Image Pickup Device Chip

In this step, the resin protective film 40 made of the epoxy resin filled in the score S is full cut diced from the second semiconductor layer 22 side, the remaining ion implanted layer and the second semiconductor layer 22 are etched, the insulating film 23 is also etched according to need, and UV light is irradiated for curing to obtain a single-surface resin sealed type ultra-thin back-illuminated solid-state image pickup device chip.

This step is similar to step 9 of the first embodiment. A cross alignment mark constituted by the resin protective film 40 made of the epoxy-based resin filled in the score S and exposed from the surface of the second semiconductor layer 22 is used as a reference for full cut dicing along the exposed resin protective film 40.

In the full cut dicing, a dicing blade thinner than that at the time of the formation of the score S formed in the previous step shown in FIG. 14A is used to dice the center of the exposed resin protective film 40 so that the resin protective film 40 remains at the chip side surfaces.

As explained in the first embodiment, the second semiconductor layer 22 is removed by a fluoric acid-based etching solution after the full cut dicing, therefore preferably use is made of a resin protective film 40 made of an epoxy-based resin and a protective tape 50 having acid resistance able to withstand this fluoric acid-based etching solution.

Note that when desiring to enlarge the air gap or there is a restriction in the acid resistance of the resin protective film, use is made of a dicing blade thicker than that at the time of formation of the score S formed in the previous step shown in FIG. 14A to dice the schematic center of the exposed resin protective film to leave the resin protective film 40 at the chip side surfaces.

By proceeding through the following steps of the step of affixing the transparent substrate (step 10) and the step of mounting to the mounting board (step 11) explained in the first embodiment, an ultra-thin back-illuminated solid-state image pickup device of a single-surface resin sealed chip size hollow package as shown in FIG. 9B is produced.

Note that when there is no air gap in the step difference between the resin protective film 40 and the insulating film 23b of the back of the chip, a sealing agent 61 containing spacers of a size corresponding to the desired air gap in an amount of 10 to 30% by weight is coated over the entire peripheral portion of the back of the chip and this is air sealed by the transparent substrate 60.

According to the method of production of a back-illuminated solid-state image pickup device according to the present embodiment, by forming an SOI substrate comprised of a support substrate 20 on which an ion implanted layer 24, a second semiconductor layer 22 made of a single crystalline Si layer, an insulating film 23, and a first semiconductor layer 12 made of a single crystalline Si layer are stacked, performing peeling use annealing, then forming a score S in the layer above the desired separation portion in advance, that is, the layer from the first semiconductor layer 12 to the ion implanted layer 24, and sealing the surface of the first semiconductor layer 12 and the interior of the score S by the resin protective film 40, stress is also applied due to the curing shrinkage stress of the resin protective film 40 made of the epoxy-based resin or the like, the efficiency of separating by tension the substrate 20 by the strain of the ion implanted layer 24 is good, and the yield, quality, and productivity can be improved.

Further, in the same way as the first embodiment, since the solid-state image pickup device chip can be held while protecting its surface by a protective tape 50 made of a conductive adhesive having a strong adhesive force and free from residual adhesive until immediately before mounting onto a printed circuit board 100, static electricity damage is prevented, bump connection failure is prevented, and further chip breakage, chipping, and cracking are prevented, so the yield and quality are improved.

Further, by inserting as the insulating film 23 between the first semiconductor layer 12 and the second semiconductor layer 22 for forming the CCD portion or CMOS sensor unit including the photoelectric conversion portion, the charge transfer portion, and the charge transfer electrodes and the bump electrodes etc. not only a single layer of silicon oxide, but also a nitride-based silicon film having an appropriate thickness using a silicon oxynitride film or a multilayer film of a silicon oxide film 23a, silicon nitride film 23b, and silicon oxide film 23c, the yield and the quality are further improved for the same reasons as in the first embodiment.

Further, by full cut dicing the resin protective film 40 made of the epoxy-based resin or the like filled in the score S from the back to obtain a chip size hollow package sealed by a transparent substrate 50 such as sealing glass via an air gap formed by the height of the resin protective film 40 remaining on the chip side surface and the chip back, a back-illuminated solid-state image pickup device of an extremely thin single-surface resin sealed chip size hollow package is obtained.

Third Embodiment

In the present embodiment, the explanation will be given of a method of production and production apparatus of a back-illuminated solid-state image pickup device of a single-surface resin sealed ultra-thin chip size hollow package using the porous layer/ion implanted layer separation method combining the porous layer separation method and ion implanted layer separation method described above (the method of separating a seed substrate by an ion implanted layer formed by implanting hydrogen atoms in the seed substrate and separating the support substrate by a porous Si layer formed on the support substrate) among the methods of fabrication of new ultra-thin SOI substrates.

Step 1: Formation of Hydrogen Ion Implanted Layer

Figure 15A:
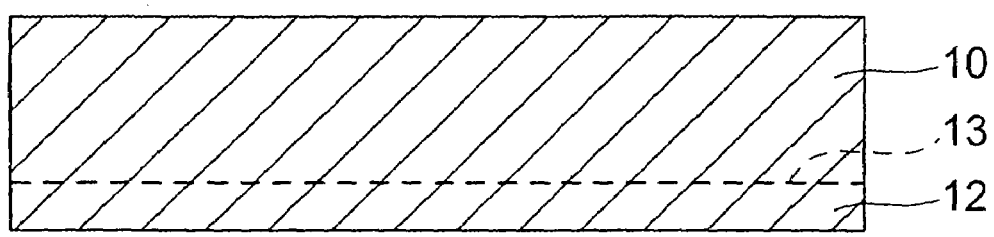
FIGS. 15A and 15B are sectional views of the state after formation of an ion implanted layer in the seed substrate and formation of a porous Si layer, a second semiconductor layer, and an insulating film in the support substrate in the production of a back-illuminated solid-state image pickup device according to a third embodiment.

First, in the same way as in the second embodiment, as shown in FIG. 15A, a seed substrate 10 made of p-type Si single crystal of 8 inch diameter and 800 μm thickness (resistivity of 0.01 to 0.02 Ωcm) is implanted with hydrogen ions to form an ion implanted layer 13. Note that the ions implanted can also be nitrogen, helium, or another dilution gas other than hydrogen. The depth of this ion implanted layer 13 from the seed substrate 10 is obtained by taking the thickness of the first semiconductor layer 12 which will form the solid-state image pickup device from the surface of the seed substrate 10 into account. For example, the hydrogen ions are implanted with a power of 500 KeV and a dosage of $5 \times 10^{16}$ to $1 \times 10^{17}/cm^2$ at a location of a depth of about 5 to 6 μm.

Step 2: Formation of Porous Layer

In the same way as the steps shown in FIG. 1B and FIG. 2B of the first embodiment, a support substrate made of p-type Si single crystal of 8 inch diameter and 800 μm thickness (resistivity of 0.01 to 0.02 Ωcm) is formed with a porous Si layer anodic conversion and formed with an insulating film.

Figure 15B:
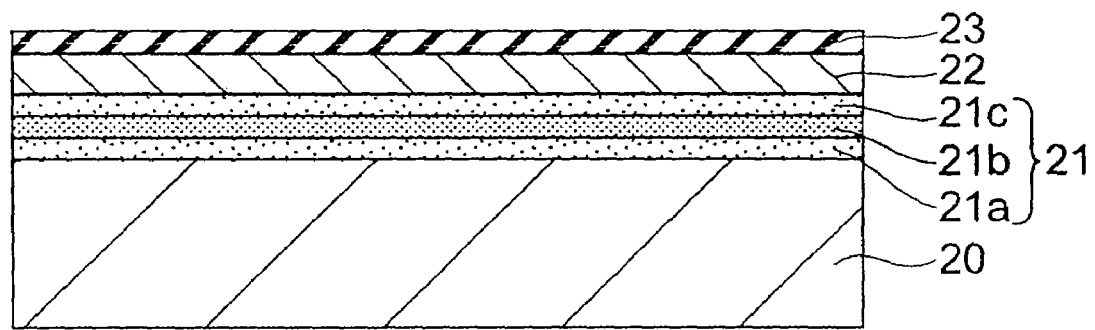

Namely, as shown in FIG. 15B, the support substrate 20 is formed with a porous Si layer 21 comprising a low porous Si layer 21a of a low porosity having a thickness of about 10 μm, a high porous Si layer 21b of a high porosity having a thickness of about 2 μm, and a low porous Si layer 21c of a low porosity having a thickness of about 10 μm.

Next, in a CVD epitaxial growth apparatus, this is pre-baked in a hydrogen atmosphere at about 1000 to 1100° C. to seal the holes of the surface of the porous Si layer 21c to flatten the surface.

After this, the temperature is lowered to 1020° C., and a second semiconductor layer 22 made of a single crystalline Si layer having a thickness of about 5 to 10 μm is formed by CVD epitaxial growth using silane gas, diborane gas, or the like as feedstock gas.

Then, reduced pressure CVD is used to form on the support substrate 20 a silicon nitride film which is then thermally oxidized to form an insulating film 23 constituted by a multilayer film of a silicon oxide film, silicon nitride film, and silicon oxide film. In this case, for example, the thickness of the silicon oxide film is set to about 200 nm, the thickness of the silicon nitride film is set to about 50 nm, and the thickness of the silicon oxide film is set to 200 nm.

The advantages in particular of the presence of a silicon nitride film having a appropriate thickness in this way are similar to those explained in the first embodiment.

Note that this insulating film 23 may also be a single layer of a silicon oxide film or a silicon oxide nitride film in the same way as the first embodiment.

Step 3: Bonding

Figure 16:
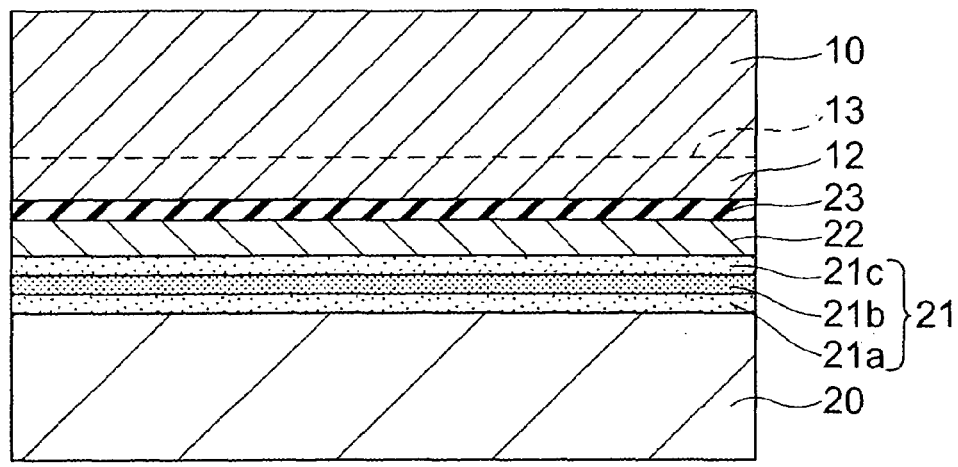
FIG. 16 is a sectional view of the state after bonding the substrates in the production of a back-illuminated solid-state image pickup device according to the third embodiment.

Next, as shown in FIG. 16, in the same way as the first embodiment, the surface of the insulating film 23 of the support substrate 20 and the surface of the seed substrate 10 are washed, then the two substrates are brought into contact from the insulating film 23 side of the support substrate 20 and the first semiconductor layer 12 side of the seed substrate at room temperature and bonded by Van der Waals force. After this, heat treatment is carried out to cause covalent bonding to strengthen the bond.

At this time, it is confirmed if there is any dust or dirt on the surfaces of the two substrates 10 and 20. If there is any foreign matter, this is peeled off and washed away.

Further, the heat treatment is preferably carried out in nitrogen or an inert gas or a mixed gas of nitrogen and an inert gas. For example, by setting the heat treatment temperature at 400° C. and performing the treatment for 30 minutes, the bond can be made stronger.

Further, it is also possible to set two superimposed substrates in a reduced pressure heat treatment furnace and hold them at a predetermined pressure (for example 133 Pa or less) by evacuation, bring them into close contact by application of pressure at the time of breaking to atmospheric pressure after a predetermined time, then heat the two in nitrogen or an inert gas or the mixed gas of nitrogen and an inert gas under an elevated temperature for continuous work.

Step 4: Separation of Seed Substrate

Figure 17:
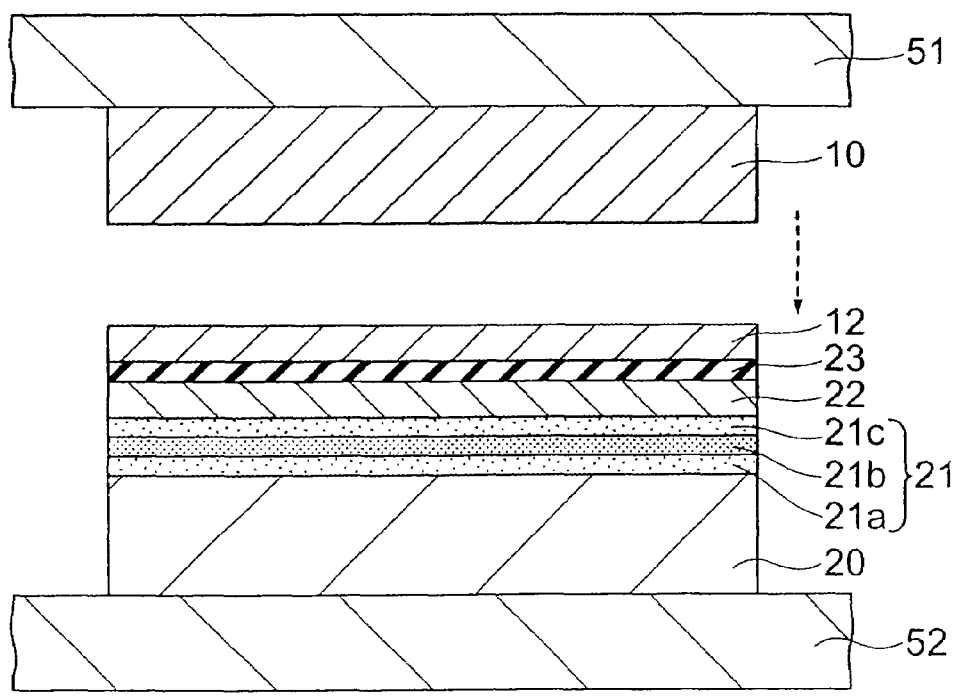
FIG. 17 is a sectional view of the state after separation of a seed substrate in the production of a back-illuminated solid-state image pickup device according to the third embodiment.

Next, as shown in FIG. 17, in the same way as the second embodiment, by peeling use annealing by heating at 500° C. for 10 to 20 minutes or rapid heating and rapid cooling (at about 800° C. for few seconds by a halogen lamp or at about 1000° C. for few milliseconds by an Xe flash lamp), strain is caused in the ion implanted layer 13 by the pressure action in the hydrogen micro bubbles present in the ion implanted layer 13 and the crystal re-alignment action, the backs of the substrates 10 and 20 are bonded to each other by UV tapes 51 and 52, and substrates are peeled by tension. At this time, to prevent separation by peeling from the porous Si layer 21, it is important to optimize the porosity of the porous Si layer 21. Next, the result is UV cured and the UV tapes 51 and 52 are peeled off. Note that, the peeled off seed substrate can be reused. Note that, in the same way as the above, it is also possible to separate this from the ion implanted layer by lasering.

Step 5: Hydrogen Annealing

In the same way as the first embodiment, after peeling off the seed substrate 10, part of the surface of the first semiconductor layer 12 made of the single crystalline Si layer is etched by hydrogen annealing to form a first semiconductor layer 12 made of a single crystalline Si layer having a desired thickness, for example, 5 μm, and flatness. The hydrogen annealing etches the Si at an etching rate of 0.0013 nm/min at 1050° C. or at an etching rate of 0.0022 nm/min at 1100° C.

By proceeding through the following steps of the step of device formation (step 6), the step of forming the score and resin protective film (step 7), the step of separating the support substrate (step 8), the step of fabrication of the back-illuminated solid-state image pickup device chip (step 9), the step of affixing the transparent substrate (step 10) and the step of mounting to the mounting board (step 11) explained in the first embodiment, an ultra-thin back-illuminated solid-state image pickup device of a single-surface resin sealed chip size hollow package as shown in FIG. 9B is produced.

According to the method of production of a back-illuminated solid-state image pickup device according to the present embodiment, by bonding the seed substrate 10 having the first semiconductor layer 12 and the ion implanted layer 13 formed thereon and the support substrate 20 having the insulating film 23, the second semiconductor layer 22, and the porous Si layer 21 formed thereon to each other and peeling off by tension the seed substrate 10 at the ion implanted layer 13 as an interface so as to form an SOI substrate comprising the support substrate 20 on which the porous Si layer 21, the second semiconductor layer 22, the insulating film 23, and the first semiconductor layer 12 are stacked., by forming the score S up to the layer above the desired separation portion in advance, that is, the second semiconductor layer 22 made of the single crystalline Si layer and the porous Si layer 21, and by sealing the surface of the first semiconductor layer 12 and the interior of the score S by the resin protective film 40, strain due to curing shrinkage stress of the resin protective film 40 made of the epoxy-based resin or the like is also added, so the efficiency of separating the support substrate 20 from the porous Si layer 21 by a water jet, air jet, or the like from the lateral direction is good, and the yield, quality, and productivity can be improved.

Other than this, similar effects to those explained in the first and second embodiments can be obtained.

Fourth Embodiment

In the first to third embodiments, an explanation was given of the example of forming a back-illuminated solid-state image pickup device of a single-surface resin sealed ultra-thin chip size hollow package by sealing by a transparent substrate 60 such as sealing glass via an air gap formed by a resin protective film 40 made of an epoxy-based resin remaining on the chip side surface as shown in FIG. 9B and the back of the chip, but in the present embodiment, an explanation will be given of the example of forming a color back-illuminated solid-state image pickup device of a single-surface resin sealed ultra-thin chip size hollow package by fixing a color filter substrate in place of a transparent substrate.

First, in the same way as the first to third embodiments, the steps of step 1 to step 8 are followed to peel off the support substrate 20 as shown in FIG. 6B or FIG. 14B. Note that in the formation of the resin protective film of step 7, a resin protective film 40 made of a transparent epoxy-based resin or the like is formed. Then, before full cut dicing, the remainder of the porous Si layer 21 and the second semiconductor layer 22 are etched, the remainder of the ion implanted layer 24 and the second semiconductor layer 22 are etched, and also the insulating film 23 is etched according to need. Further, according to need, the projecting portion of the resin protective film 40 produced by the etching of the second semiconductor layer 22 etc. is removed by etching or the like.

Next, for use for a CCD sensor unit or CMOS sensor unit of a solid-state image pickup element, a color filter substrate 70 having a color filter layer 70a made of resin films having pigments corresponding to red, green, and blue formed therein is bonded from the insulating film 23 side via a transparent adhesive 71. The color filter substrate 70 is made of for example a glass substrate, a transparent resin substrate, etc.

Figure 18A:
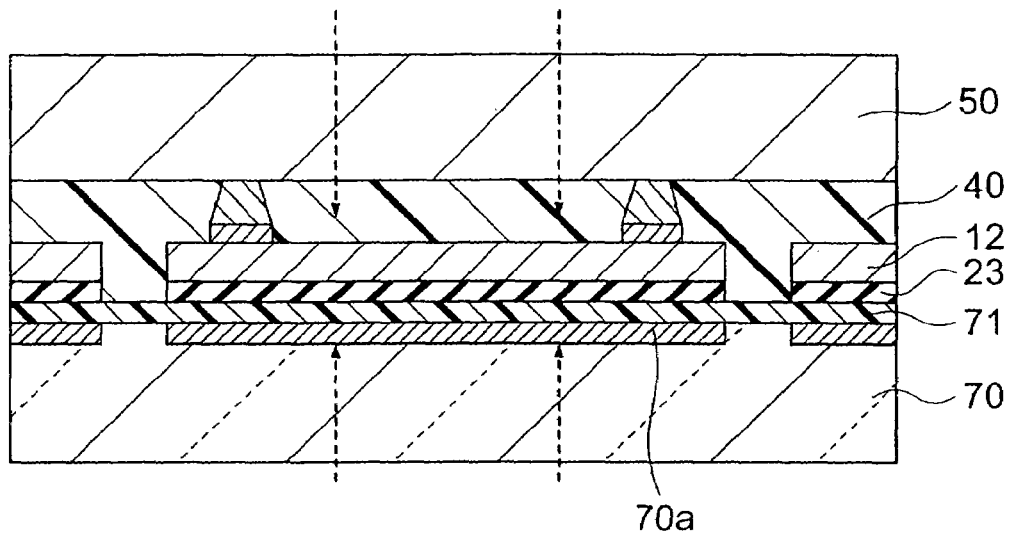
FIGS. 18A and 18B are sectional views of the state after affixing a color filter substrate in the production of a back-illuminated solid-state image pickup device according to a fourth embodiment.
Figure 18B:
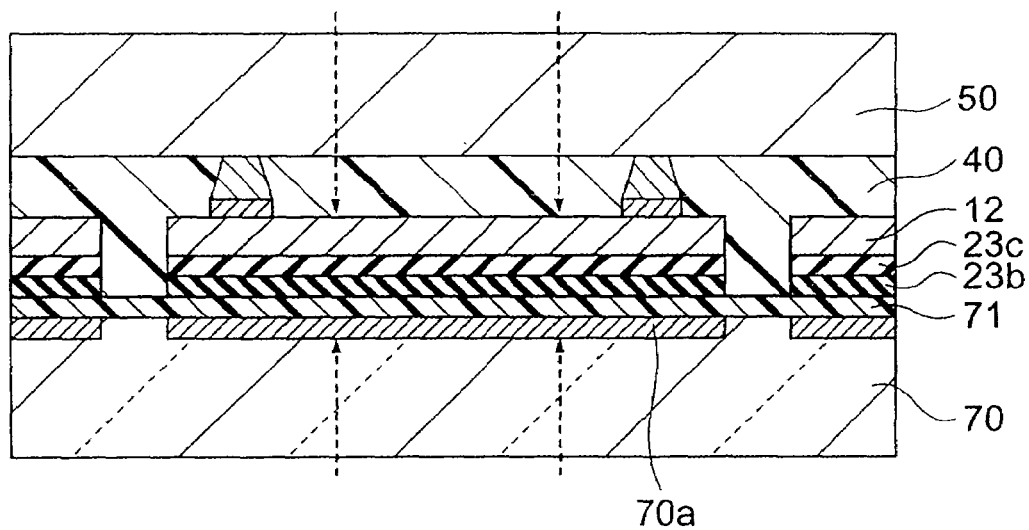

FIG. 18A is a sectional view of the state after affixing the color filter substrate 70 in the case where the insulating film 23 is a single layer; and FIG. 18B is a sectional view of the state after affixing the color filter substrate 70 in the case where the insulating film 23 is a multilayer film. Note that, FIG. 18B shows a situation where the insulating film is constituted by two layers of the silicon nitride film 23b and the silicon oxide film 23a by the removal of the silicon oxide film in the previous step.

At this time, the alignment mark of the chip surface and the alignment mark of the color filter substrate 70 are aligned in position by an integral front/back type microscope via the resin protective film 40 made of the transparent epoxy-based resin or the like, then the transparent adhesive 71 is cured to affix the substrates.

The transparent adhesive 71 is preferably a UV curing and heat curing adhesive. That is, preferably, immediately after the position alignment, the substrates are locally temporarily fixed by UV curing, then heat curing is carried out.

Further, the protective tape 50 is desirably a transparent conductive UV curing adhesive free from residual adhesive and preventing static electricity damage.

Figure 19A:
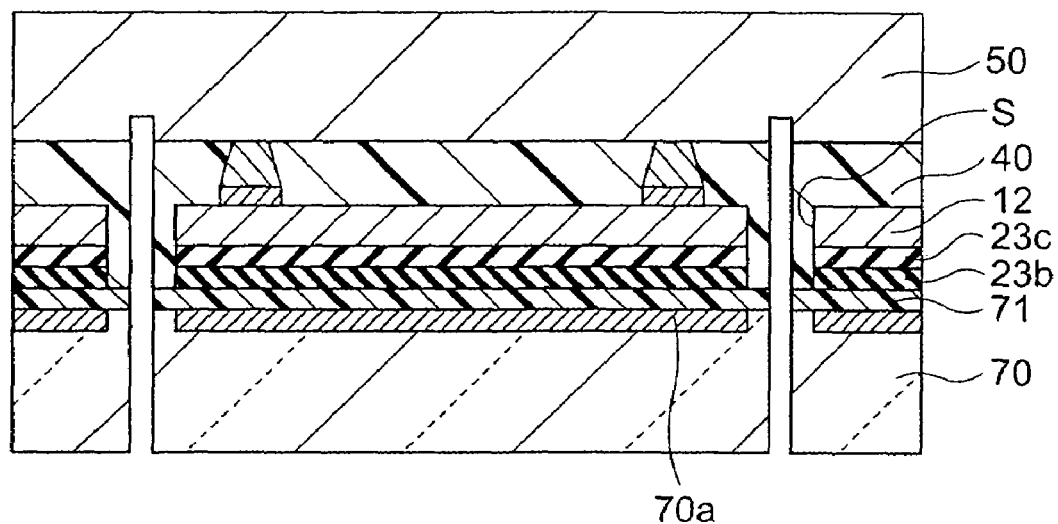
FIGS. 19A and 19B are sectional views of the state after full dicing and after mounting to the mounting board in the production of a back-illuminated solid-state image pickup device according to the fourth embodiment.

Next, as shown in FIG. 19A, the color filter substrate 70 and the resin protective film 40 made of the epoxy-based resin filled in the score S are full cut diced from the color filter substrate 70 side, then the result is cured by UV light and the protective tape 50 is peeled off to thereby obtain a color back-illuminated solid-state image pickup device chip.

This step is similar to step 9 of the first embodiment. Using the cross alignment mark constituted by the resin protective film 40 made of the epoxy-based resin filled in the score S as a reference, full cut dicing is carried out along the resin protective film 40.

In the full cut dicing, it is also possible to use a dicing blade thinner than that at the formation of the score S formed in the previous step to dice the center of the exposed resin protective film 40 so that the resin protective film 40 remains on the chip side surfaces so as to try to improve the humidity resistance. Note that, in the case of a device having no problem in reliability, it is not always necessary to leave the resin protective film 40 on the chip side surfaces.

Figure 19B:
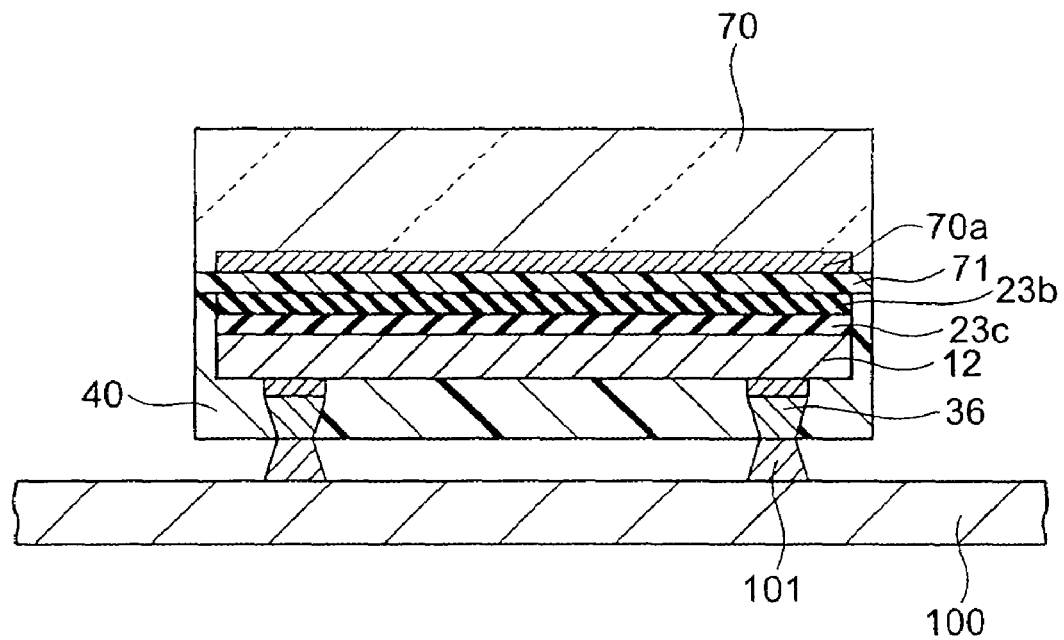

Finally, as shown in FIG. 19B, using silver paste, solder paste, or another conductive paste 101, the color back-illuminated solid-state image pickup device chip formed in the previous step is mounted on a printed circuit board (PCB) 100 comprising a glass epoxy substrate, flexible printed circuit board, etc.

At this time, until immediately before mounting onto the printed circuit board 100, the chip is protected at its surface and held by the protective tape 50 of the conductive adhesive having a strong adhesive force and free from residual adhesive and the bump electrodes are short circuited, so static electricity damage is prevented and bump connection failure is prevented, so the yield and quality are improved.

According to the back-illuminated solid-state image pickup device according to the present embodiment described above, by using the same methods as those of the first to third embodiments to peel off the support substrate 20, then etch away the remainder of the porous Si layer 21 or ion implanted layer 24 and the second semiconductor layer 22 to obtain the single-surface resin sealed back-illuminated solid-state image pickup device, monitoring the alignment mark of the chip surface and the alignment mark of the color filter substrate 70 by an integral front/back type microscope via the transparent resin protective film 40 to adjust the position with respect to this and affixing the color filter substrate 70 by the transparent adhesive 71, separating this to an individual chip by full cut dicing from the back of the color filter substrate 70, then peeling off the protective tape 50, an extremely thin, chip size single-surface resin sealed color back-illuminated solid-state image pickup device is obtained. Other than this, there are the same effects as the effects explained in the first embodiment to the third embodiment.

Fifth Embodiment

In the first to third embodiments, the explanation was given of the example of forming the chip size hollow package by sealing by a transparent substrate 60 such as sealing glass via an air gap formed by a resin protective film 40 made of an epoxy-based resin remaining on the chip side surface as shown in FIG. 9B and the back of the chip, but in the present embodiment, the explanation will be given of the example of further forming an on-chip color filter (OCCF) and an on-chip lens (OCL) on the insulating film 23, then forming a color back-illuminated solid-state image pickup device of a single-surface resin sealed ultra-thin chip size hollow package to be sealed by the transparent substrate.

Figure 20A:
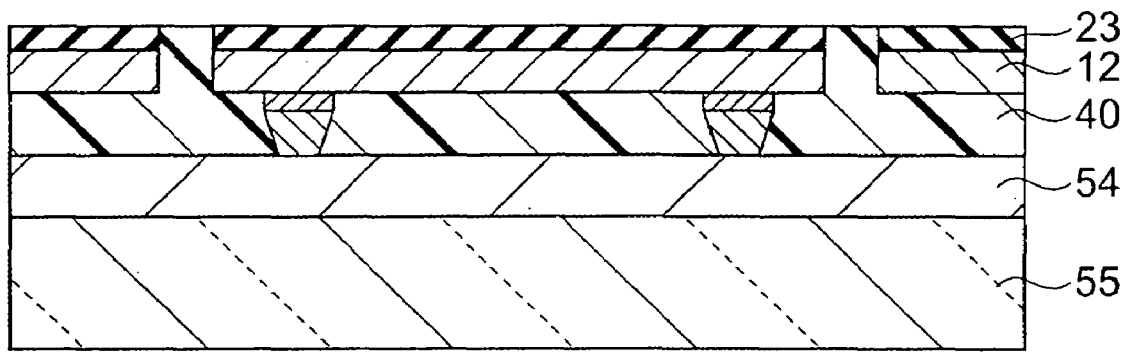
FIGS. 20A and 20B are sectional views of the state after formation of an on-chip color filter and an on-chip lens in the production of a back-illuminated solid-state image pickup device according to a fifth embodiment.

First, in the same way as the first to third embodiments, the steps of step 1 to step 8 are followed so as, as shown in FIG. 6B or FIG. 14B, to peel off the support substrate 20. Then, before the full cut dicing, the remainder of the porous Si layer 21 and the second semiconductor layer 22 are etched away, the remainder of the ion implanted layer 24 and the second semiconductor layer 22 are etched away, and the insulating film 23 is etched away according to need. Further, according to need, the projecting portion of the resin protective film 40 generated due to the etching of the second semiconductor layer 22 removed by etching. Note that in the formation of the resin protective film of step 7, a resin protective film 40 made of a transparent epoxy-based resin or the like is formed. Further, in the following steps, a glass substrate 55 or the like is bonded to the surface of the resin protective film 40 by a two-sided bonding protective tape 54 serving as the support substrate for forming the on-chip color filter or the on-chip lens. FIG. 20A is a sectional view of the state after this step. As the two-sided bonding protective tape 54, desirably use is made of a transparent conductive UV curing adhesive and tape for preventing static electricity damage and are free from remaining adhesive.

Figure 20B:
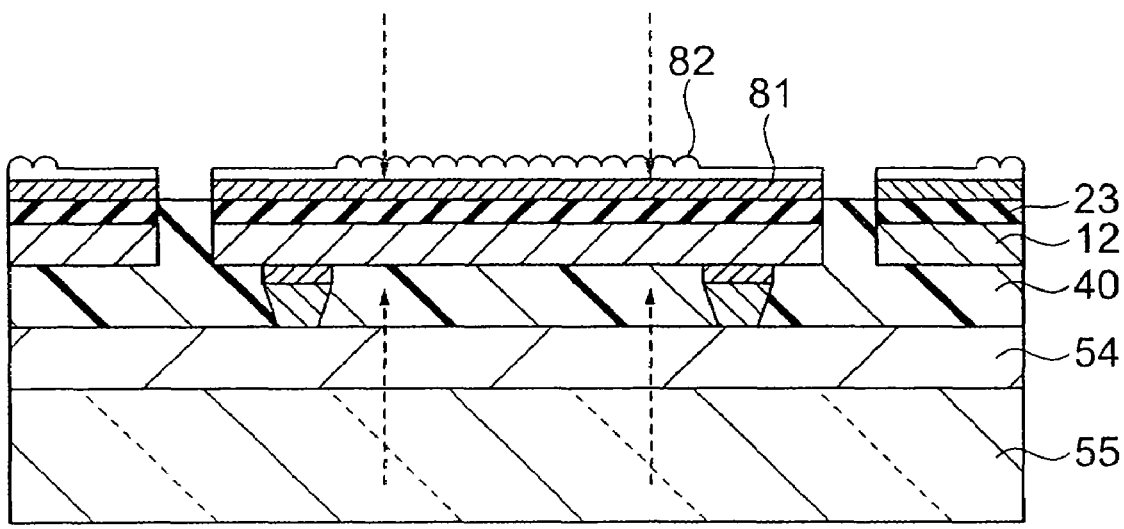

Next, as shown in FIG. 20B, the insulating film 23 is formed with an on-chip color filter 81 by for example forming a coloring resin having photo-sensitivity and containing a pigment dispersed therein in the pattern of the color filter by photolithography. Specifically, this is formed by coating a coloring resin having photo-sensitivity and containing a pigment dispersed therein, baking it by a hot plate at a temperature from 90° C. to 100° C. for 90 seconds to 120 seconds, then exposing this using an i-beam stepper or the like, developing it by a TMAH (tetramethyl disilane) aqueous solution or other alkali development solution, and then curing by the hot plate at a temperature of 100° C. to 120° C. for 90 seconds to 120 seconds. These steps are repeated for a required number of times.

For example, in the case of an image sensor of a primary color type, the steps are repeated three times for red, blue, and green, and in the case of an image sensor of a complementary color type, the steps are repeated four times for cyan, magenta, yellow, and green.

Then, as shown in FIG. 20B, the on-chip color filter 81 is formed with a lens material of a light transmission type resin such as a negative type photo-sensitivity resin, a resist pattern of a lens shape having a predetermined curvature is formed on the lens material corresponding to each pixel in the CCD sensor or the CMOS sensor by reflowing, and an on-chip micro lens 82 having a predetermined curvature is formed by etching the lens material using the resist pattern as a mask.

At the formation of the on-chip color filter 81 and the on-chip micro lens 82, the alignment mark on the chip surface is recognized via the glass substrate 55 and two-sided bonding protective tape 54 and the resin protective film 40 made of the transparent epoxy-based resin, and the on-chip color filter 81 and the on-chip micro lens 82 are formed on the insulating film 23 corresponding to the pixels in a plurality of CCD or CMOS sensor units using the alignment mark as a reference.

Figure 21A:
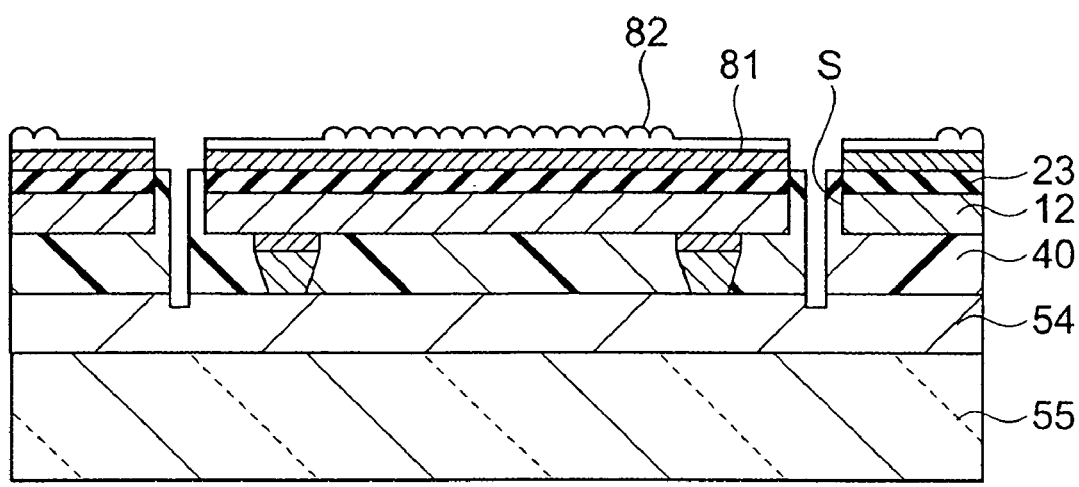
FIGS. 21A and 21B are sectional views of the state after full dicing and after mounting to the mounting board in the production of a back-illuminated solid-state image pickup device according to the fifth embodiment.

Next, as shown in FIG. 21A, the resin protective film 40 made of a transparent epoxy-based resin filled in the score S is full cut diced from the on-chip micro lens 82 side.

In this step, using the cross alignment mark constituted by the resin protective film 40 made of the epoxy-based resin filled in the score S as a reference, full cut dicing is carried out along the resin protective film 40.

In the full cut dicing, it is also possible to use a dicing blade thinner than that at the formation of the score S formed in the previous step to dice the approximate center of the resin protective film 40 so that the resin protective film 40 remains on the chip side surfaces so as to try to improve the humidity resistance. Note that, in the case of a device having no problem in reliability, it is not always necessary to leave the resin protective film 40 on the chip side surfaces.

Figure 21B:
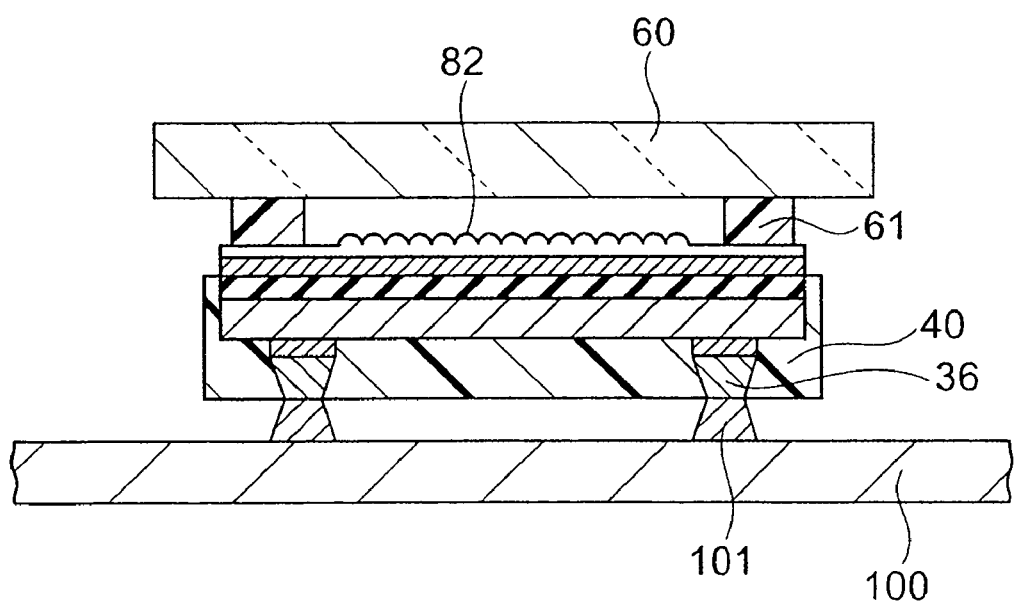

Then, as shown in FIG. 21B, the single-surface resin sealed back-illuminated solid-state image pickup device chip is mounted on a transparent substrate 60 made of a sealing glass or a humidity resistant transparent film or the like with a predetermined air gap by a sealing agent 61. Next, UV light is irradiated and the two-sided bonding protective tape 54 and the glass substrate 55 are peeled off to thereby fabricate the single-surface resin sealed ultra-thin chip size hollow package.

The sealing agent 61 used in this step may also be any of a low temperature heat curing adhesive, a UV curing adhesive, and a UV curing and low temperature heat curing adhesive, but must be a material having a high humidity resistance.

Further, in order to obtain a predetermined air gap between the transparent substrate 60 and the on-chip micro lens 82, the sealing agent 61 preferably has mixed into it spacers having the same size as the air gap. The spacers may be any of glass, metal, plastic, or a mixture of the same. The mixing ratio of the spacers into the sealing agent is preferably set at a level not deteriorating the humidity resistance, for example, about 10 to 30% by weight.

Note that the transparent substrate 60, the sealing agent 61, the spacers, the on-chip micro lens 82, the on-chip color filter 81, the resin protective film 40, the bump electrode 36, and other materials forming the solid-state image pickup device must be high purity materials not producing α-rays in order to prevent deterioration of the image quality.

Finally, using silver paste, solder paste, or another conductive paste 101, the color back-illuminated solid-state image pickup device chip formed in the previous step is mounted on a printed circuit board (PCB) 100 comprising a glass epoxy substrate, flexible printed circuit board, etc.

At this time, until immediately before mounting onto the printed circuit board 100, the chip is protected at its surface and held by the two-sided adhesive protective tape 54 of the conductive adhesive having a strong adhesive force and free from residual adhesive and the bump electrodes are short circuited, so static electricity damage is prevented and bump connection failure is prevented, so the yield and quality are improved.

According to the method of production of the back-illuminated solid-state image pickup device according to the present embodiment, by using the same methods as those of the first to third embodiments to peel off the support substrate 20, then etch away the remainder of the porous Si layer 21 or the ion implanted layer 24 and the second semiconductor layer 22, recognize the alignment mark of the chip surface via the glass substrate 55 and the two-sided adhesive protective tape 54 and the resin protective film 40 made of the transparent epoxy-based resin, and use the related alignment mark as a reference to form an on-chip color filter 81 and on-chip lens 82 on the insulating film 23 for a plurality of CCD or CMOS sensor units, then affixing the transparent substrate 60 by a predetermined air gap, a color back-illuminated solid-state image pickup device of an extremely thin single-surface resin sealed chip size hollow package is obtained. Other than this, the same effects as the effects explained in the first embodiment to the third embodiment are obtained.

Sixth Embodiment

In the present embodiment, an explanation will be given of the example of applying the method of production and the production apparatus of a back-illuminated solid-state image pickup device of a single-surface resin sealed ultra-thin chip size hollow package according to the present embodiment to form a back-illuminated solid-state ray detection device of a single-surface resin sealed ultra-thin chip size hollow package able to detect the X-rays, y-rays, charged particles, or other high energy rays as in the technology disclosed in Japanese Unexamined Patent Publication (Kokai) No. 10-209417.

Step 1: Formation of Porous Si Layer

In the same way as the steps shown in FIG. 1 and FIG. 2 of the first embodiment, porous Si layers are formed on the seed substrate and the support substrate by anodic conversion and an insulating film is formed.

Figure 22A:
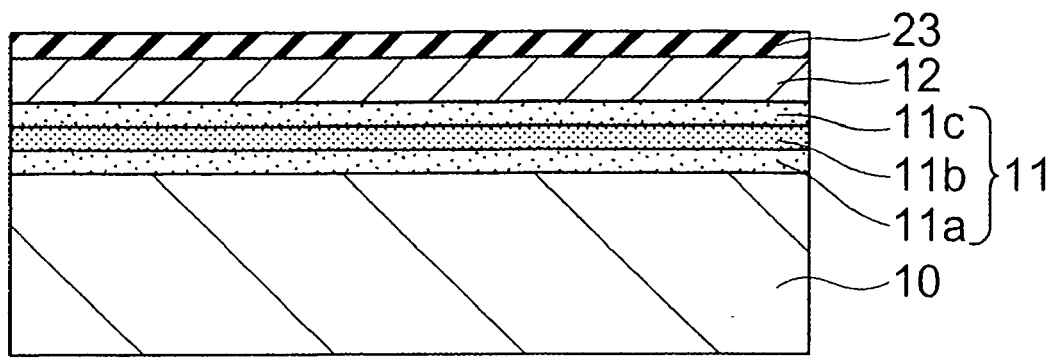
FIGS. 22A and 22B are sectional views of the state after the step of formation of a porous Si layer, a semiconductor layer, and an insulating film in the production of a back-illuminated solid-state image pickup device according to a sixth embodiment.

Namely, as shown in FIG. 22A, the seed substrate 10 is formed by anodic conversion with a porous Si layer 11 constituted by a low porous Si layer 11a of a low porosity having a thickness of about 10 μm, a high porous Si layer 11b of a high porosity having a thickness of about 20 μm, and a low porous Si layer 11c of a low porosity having a thickness of about 5 μm.

Figure 22B:
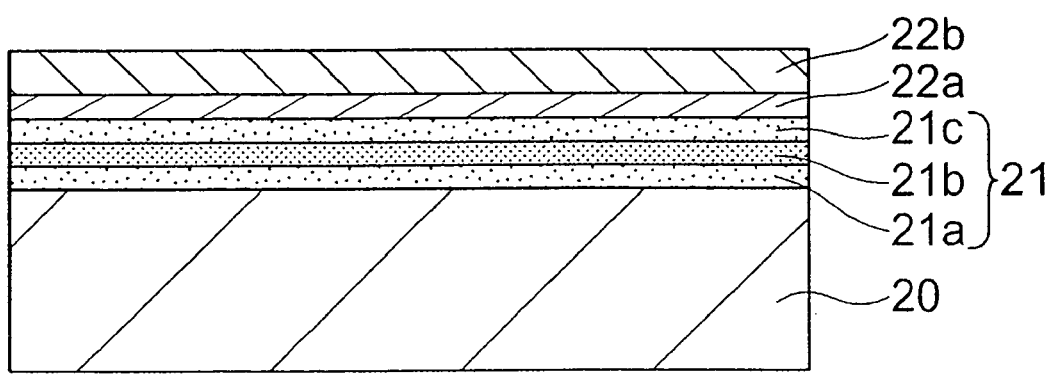

Further, as shown in FIG. 22B, the support substrate 20 is formed with a porous Si layer 21 constituted by a low porous Si layer 21a of a low porosity having a thickness of about 10 μm, a high porous Si layer 21b of a high porosity having a thickness of about 2 μm, and a low porous Si layer 21c of a low porosity having a thickness of about 10 μm.

Step 2: Formation of Semiconductor Layer and Insulating Film

In this step, both substrates of the seed substrate 10 and the support substrate 20 are formed with epitaxially grown single crystalline Si layers, while at least one is formed with a silicon oxide film or a multilayer film of a silicon oxide film, silicon nitride film, and silicon oxide film as an insulating film.

Namely, as shown in FIG. 22A, the two substrates of the seed substrate 10 and the support substrate 20 are pre-baked in a CVD epitaxial growth apparatus in a hydrogen atmosphere at about 1000 to 1100° C. to seal the holes of the surfaces of the porous Si layers 11 and 21 to flatten the surfaces.

Thereafter, the temperature is elevated up to 1020° C., CVD is carried out using silane gas or diborane gas as a feedstock gas, and the same procedure is followed as in step 2 of the first embodiment to form on the seed substrate 10 a first semiconductor layer 12 having a thickness of about 5 to 10 μm made of an epitaxially grown p$^-$-type single crystalline Si layer for forming a CCD, bucket brigade device (BBD), or other charge transfer device (CTD).

Then, the seed substrate 10 is for example formed with an insulating film 23 made of silicon oxide having a thickness of about 200 to 300 nm.

Note that, in the same way as the first embodiment, this insulating film 23 can be a single layer of silicon oxide, but may also be a multilayer film of a silicon oxide film, silicon nitride film, and silicon oxide film obtained by using reduced pressure CVD to form a silicon nitride film on the support substrate 20 and thermally oxidizing it. In this case, for example the thickness of the silicon oxide film is set to about 200 nm, the thickness of the silicon nitride film is set to about 50 nm, and the thickness of the silicon oxide film is set to 200 nm. The advantages in particular of the presence of a silicon nitride film having a appropriate thickness in this way are similar to those explained in the first embodiment.

Further, as shown in FIG. 22B, the support substrate 20 is formed with a second semiconductor layer 22a made of an epitaxially grown p$^+$-type Si single crystal and having a thickness of about 2 to 5 μm and a third semiconductor layer 22b made of a p$^-$-type Si single crystal and having a thickness of about 20 to 30 μm. Further, the third semiconductor layer 22b is implanted with phosphorus ions as an n-type impurity by ion implantation or the like so as to form an n-type semiconductor region. This n-type semiconductor region, the p⁻-type region of the third semiconductor layer 22b, and the p⁺-type region of the second semiconductor layer 22a form a photoelectric conversion element made of a PIN photodiode. Further, the third semiconductor layer 22b is implanted with boron ions as a p-type impurity by ion implantation or the like to form a channel stopper.

Step 3: Bonding

Figure 23A:
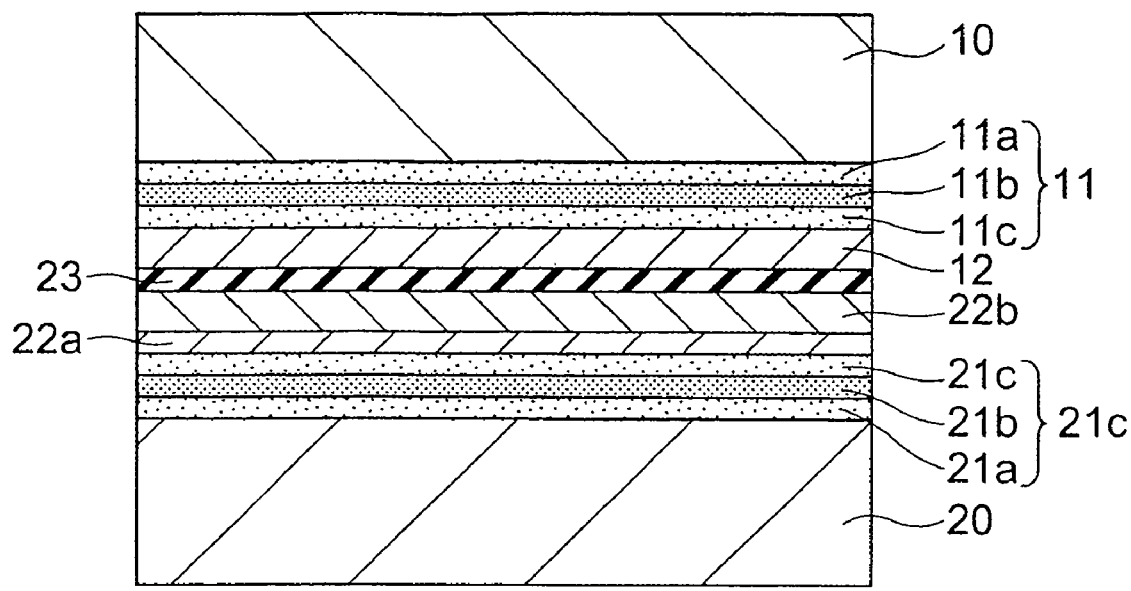
FIGS. 23A and 23B are sectional views of the state after bonding of substrates and peeling off the seed substrate in the production of a back-illuminated solid-state image pickup device according to the sixth embodiment.

Next, as shown in FIG. 23A, the insulating film 23 surface of this seed substrate 10 and the surface of the support substrate 20 are washed, then the substrates are brought into contact with each other from the insulating film 23 side of the seed substrate 10 and the third semiconductor layer 22b side of the support substrate 20 at room temperature and made to bond by Van der Waals force. Next, they are heat treated to cause covalent bonding to thereby strengthen the bonding.

At this time, it is confirmed if there is any deposition of dust or dirt on the surfaces of the two substrates 10 and 20. If there is any foreign matter, it is peeled and washed away.

Further, the heat treatment is preferably carried out in nitrogen or an inert gas or a mixed gas of nitrogen and an inert gas. For example, by setting the heat treatment temperature at 400° C. and performing the treatment for 30 minutes, the bond can be made stronger.

Further, it is also possible to set two superimposed substrates in a reduced pressure heat treatment furnace and hold them at a predetermined pressure (for example 133 Pa or less) by evacuation, bring them into close contact by application of pressure at the time of breaking to atmospheric pressure after a predetermined time, then heat the two in nitrogen or an inert gas or the mixed gas of nitrogen and an inert gas under an elevated temperature for continuous work.

Step 4: Separation of Seed Substrate

Figure 23B:
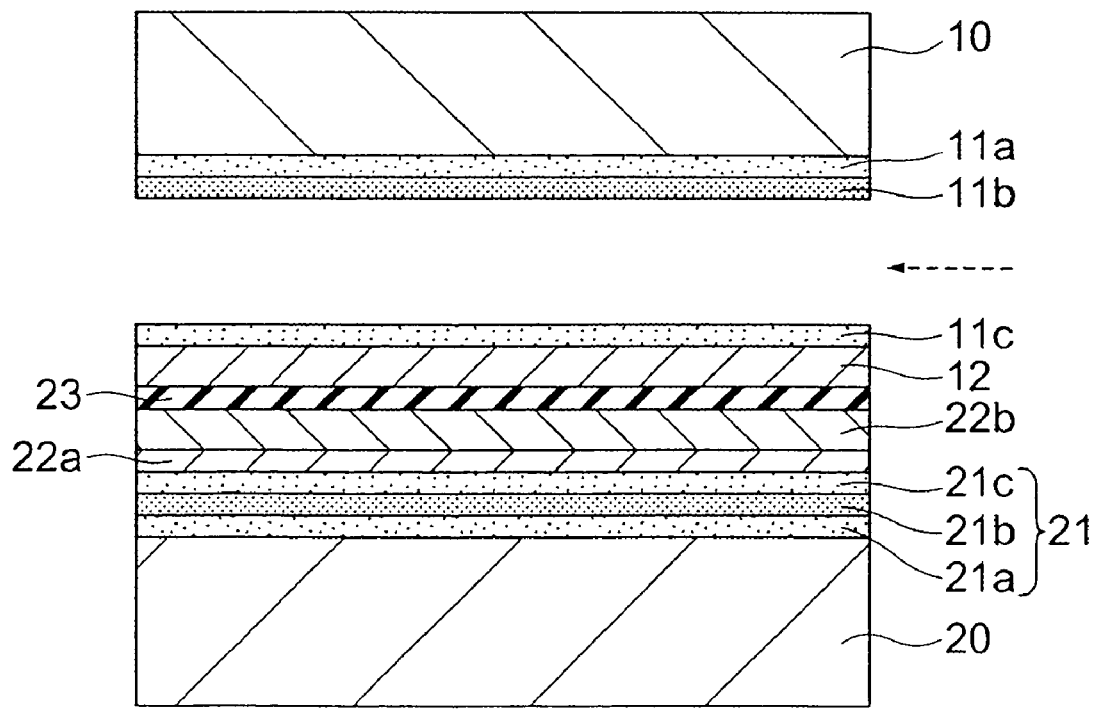

Next, as shown in FIG. 23B, the seed substrate 10 is separated from the porous Si layer 11b by an air jet, water jet, or the like. At this time, the seed substrate 10 will be peeled off by the pressure action by the air jet, water jet, or the like by forming the high porous Si layer 11b having a porosity and thickness larger than those of the high porous Si layer 21b.

At this time, in the same way as the first embodiment, it is also possible to use a jig provided with a wall of a guard ring stopper so that the peeling action by the air jet, water jet, or the like will not act upon the high porous Si layer 21b. The height of this guard ring stopper and the height of the high porous Si layer 21b are finely adjusted and the height of the support substrate holder is finely adjusted so that the peeling action by the air jet, water jet, or the like will not be felt. Note that, the peeled seed substrate can be reused.

Note that it is also possible to separate this from the porous Si layer by the lasering process in the same way as the above.

Step 5: Hydrogen Annealing

Figure 24A:
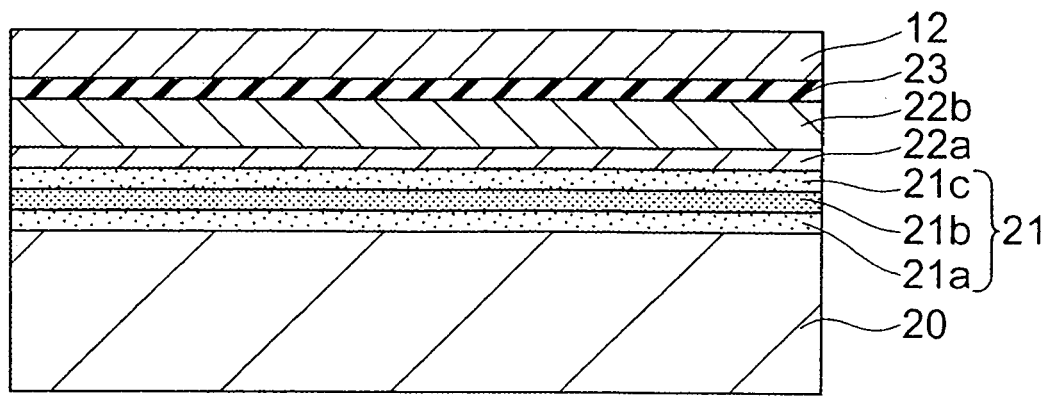
FIGS. 24A and 24B are sectional views of the state after hydrogen annealing and formation of a device in the production of a back-illuminated solid-state image pickup device according to the sixth embodiment.

Next, as shown in FIG. 24A, the entire low porous Si layer 11c remaining after peeling and part of the surface of the first semiconductor layer 12 are etched by hydrogen annealing to form a first semiconductor layer 12 made of single crystalline Si having a desired thickness and flatness, for example, a thickness of about 5 μm.

In the hydrogen annealing, the Si is etched at an etching rate of 0.0013 nm/min at 1050° C. and 0.0022 nm/min at 1100° C.

Note that it is also possible to etch the surface of the first semiconductor layer 12 made of the single crystalline Si by hydrogen annealing after etching the low porous Si layer 11c remaining after peeling by a liquid mixture of HF, $H_2O_2$, and $H_2O$ or a liquid mixture of HF, $HNO_3$, and $CH_3COOH$.

Step 6: Device Formation

Next, by the well known technology disclosed in Japanese Unexamined Patent Publication (Kokai) No. 10-209417, the first semiconductor layer 12 made of the p⁻-type single crystalline Si layer is formed with a CCD, BBD, or other CTD and bump electrodes connected to the same.

Figure 24B:
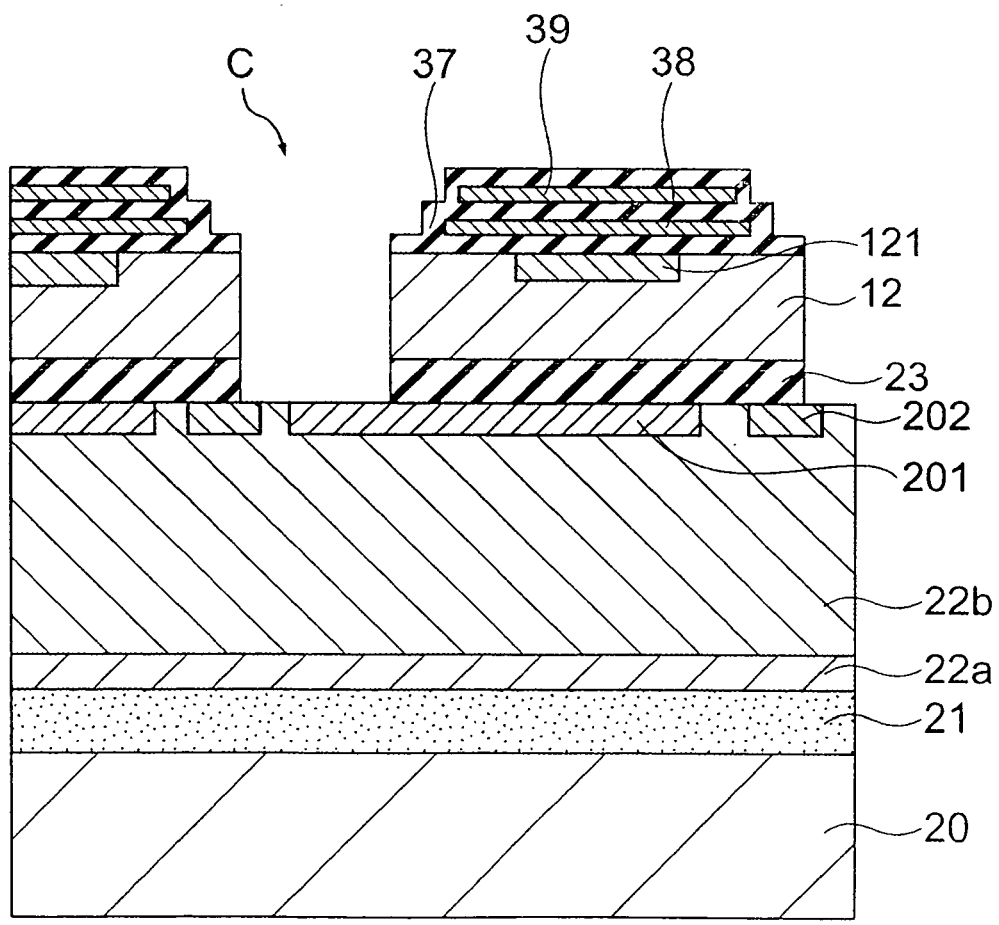

Namely, as shown in FIG. 24B, the first semiconductor layer 12 made of the p⁻-type single crystalline Si layer is implanted with ions of an n-type impurity to form a buried transfer channel region 121 serving as a buried channel CCD as the CTD and further is formed with transfer electrodes 38 and 39 made of two layers of polycrystalline silicon via an insulating film 37. Further, for example, after forming the transfer electrodes 38 and 39, parts of the first semiconductor layer 12 and the insulating film 23 are removed by etching or the like to form an opening C.

Note that the third semiconductor layer 22b is formed with an n-type semiconductor region 201 and a p-type channel stopper 202 fabricated by ion implantation in the previous step shown in FIG. 22B. This n-type semiconductor region 201, the p⁻-type region of the third semiconductor layer 22, and the p⁺-type region of the second semiconductor layer 22a form a photoelectric conversion element made of a PIN photodiode.

Note that, although not illustrated, the opening C is formed with a transfer gate etc. for transfer of charges between the PIN photodiode and the buried transfer channel region 121.

In the back-illuminated solid radiation ray detection device disclosed in FIG. 24B, a depletion layer can be extended deep by utilizing the PIN photodiode, so the detection efficiency of high energy rays can be raised. The incident rays striking from the back of the first semiconductor layer 12, that is, the third semiconductor layer 22b side, are converted to charge by the PIN photodiode. The charge generated by the photoelectric conversion is transferred to the buried transfer channel region 121 by a not illustrated transfer gate, further transferred to the horizontal transfer CTD, and output from the output gate.

Further, by forming the buried transfer channel region 121 acting as the vertical transfer CTD and the transfer electrodes 38 and 39 in the first semiconductor layer 12 and forming the PIN photodiode in the second semiconductor layer 22a and the third semiconductor layer 22b to obtain a multilayer structure, the substantial light receiving area of the photoelectric conversion element can be enlarged without competing with the transfer circuit and the photoelectric conversion element.

Step 7: Formation of Score and Protective Film

Figure 25A:
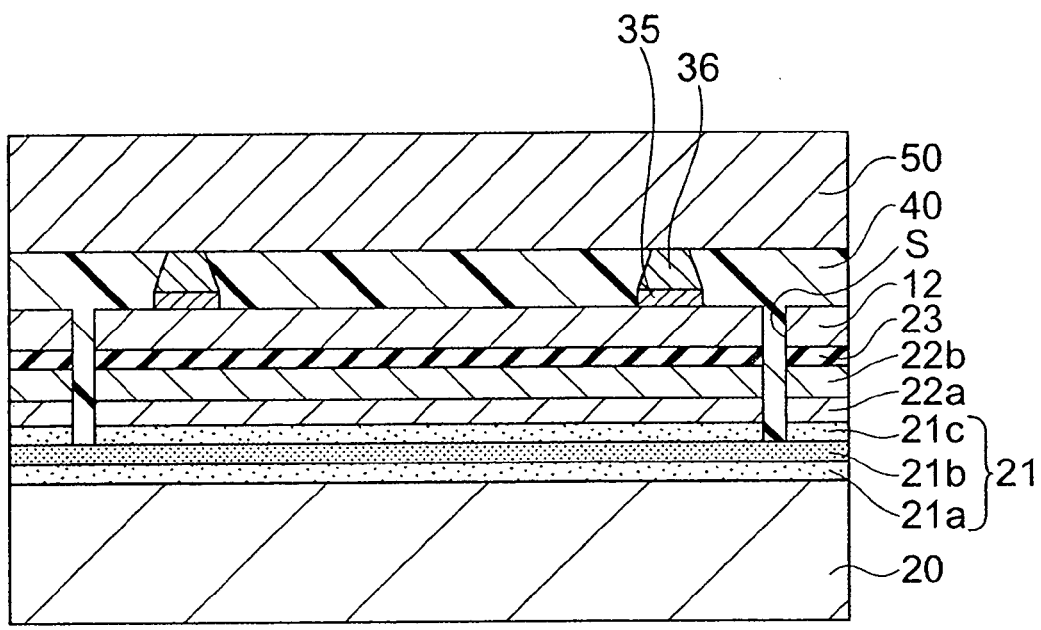
FIGS. 25A and 25A are sectional views of the state after forming a score and a resin protective film and separating the support substrate in the production of a back-illuminated solid-state image pickup device according to the sixth embodiment.

Next, as shown in FIG. 25A, a score S is formed by dicing along a scheduled pellet division border line in a scribe line from the first semiconductor layer 12 side to pass through at least the second semiconductor layer 22a comprised of the single crystalline Si, then this is sealed by an epoxy resin or other resin protective film 40. The surface of the resin protective film 40 is polished on one side by optical polishing, chemical mechanical polishing (CMP), etc. to expose the bump electrode 36. The surface of the exposed bump electrode 36 is Au flash plated and is protected by a UV tape or other protective tape 50 according to need. Note that, in this step, in order to form the air gap by the resin protective film 40 later, preferably the score S is formed so as to reach the porous Si layer 21 by exactly a predetermined depth over the second semiconductor layer 22a.

As the protective tape 50, desirably use is made of a transparent conductive UV curing adhesive and tape free from remaining adhesive for preventing static electricity damage.

Step 8: Separation of Support Substrate

Figure 25B:
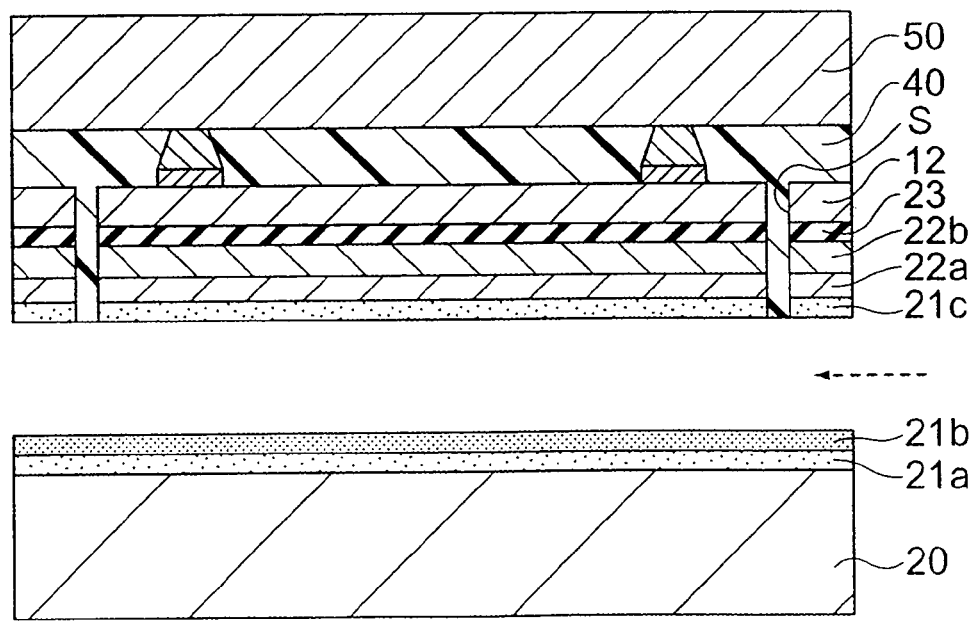

Next, as shown in FIG. 25B, the support substrate 20 is separated at the high porous Si layer 21b by an air jet, water jet, or the like. At this time, the score S reaching the porous Si layer 21 is filled with the resin protective film 40. Strain due to curing shrinkage stress of this resin protective film 40 made of epoxy-based resin or the like is also added. The efficiency for separating the support substrate 20 at the high porous Si layer 21b by a water jet or the like from the lateral direction therefore becomes better. For this reason, the mechanical shock etc. to the devices already formed in the first semiconductor layer 12, the second semiconductor layer 22a, and the third semiconductor layer 22b can be reduced. Note that the support substrate can be reused.

Note that, in the same way as the above description, it is also possible to separate this from the porous Si layer by lasering.

As the following steps, steps similar to those of step 9 to step 11 explained in the first embodiment are performed.

Namely, in the same way as step 9 of the first embodiment, the resin protective film 40 made of the epoxy resin filled in the scribe line is full cut diced from the side of the second semiconductor layer 22, and the remainder of the high porous Si layer 21b and the low porous Si layer 21c is etched away, whereby a single-surface resin sealing type back-illuminated solid-state image pickup device chip is obtained.

Then, in the same way as step 10 of the first embodiment, using the step difference between the resin protective film 40 made of the epoxy-based resin on the side surface of the back-illuminated solid-state image pickup device chip and the second semiconductor layer 22a on the back of the chip as an air gap, a transparent substrate 60 made of sealing glass, humidity resistant transparent film, or the like is affixed to the single-surface resin sealing type back-illuminated solid-state image pickup device chip by a sealing agent 61, and the protective tape 50 is peeled off, to form the chip size hollow package.

Figure 26:
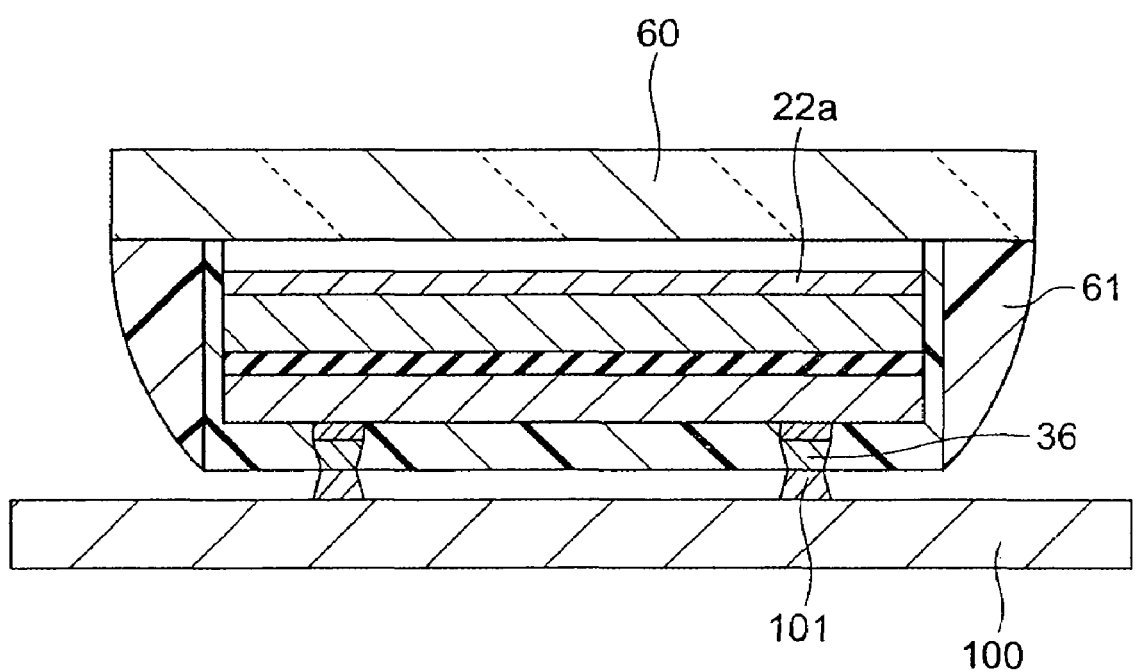
FIG. 26 is a sectional view of the state after mounting to a mounting board in the production of a back-illuminated solid-state image pickup device according to the sixth embodiment.

Further, using silver paste, solder paste, or another conductive paste 101 to mount the chip size hollow package prepared in the previous step on a printed circuit board (PCB) 100 constituted by a glass epoxy substrate, flexible printed board, or the like, the back-illuminated solid-state image pickup device shown in FIG. 26 is produced.

As in the present embodiment, by not removing the semiconductor layer 22 existing under the first semiconductor layer 12 via the insulating film 23 as in the first to third embodiments, but making it act as a device forming film, it is also possible to form a back-illuminated ray detection device as mentioned above. In this case as well, after forming the device in the first semiconductor layer 12, a score S reaching the porous Si layer 21 is formed, and a resin protective film 40 for sealing the surface of the first semiconductor layer 12 and the score S is formed, whereby strain due to curing shrinkage stress of the resin protective film 40 made of the epoxy-based resin or the like is added, the efficiency of separating the support substrate 20 from the porous Si layer 21 by a water jet or the like from the lateral direction is raised, and thus the yield and the productivity can be improved. Other than this, effects in similar to the effects explained in the first embodiment to the third embodiment can be obtained.

The present invention is not limited to the explanation of the above embodiments.

For example, the structure of the CCD sensor unit or the CMOS sensor unit of the back-illuminated solid-state image pickup device is not particularly limited. A BBD sensor unit etc. can also be employed. Further, in the embodiments, the explanation was given of the example of forming a score for promoting the peeling from the porous Si layer or the ion implanted layer, but the invention is not limited to the porous Si layer or the ion implanted layer. A layer having a similar function can be employed too in the method of fabrication of the SOI substrate.

Further, the insulating film 23 can also be not only a silicon nitride film or a multilayer film of a silicon oxide film, silicon nitride film, and silicon oxide film, but also a multilayer film of a silicon nitride film, a silicon oxide film, and a silicon nitride film, a silicon oxynitride film, or an aluminum oxide film and can be constituted by still another insulation material too.

Other than this, various modifications are possible in a range not out of the gist of the present invention.

Summarizing the effects of the present invention, according to one aspect of the invention, by forming a base comprised of a support substrate on which a porous semiconductor peeling layer, a second single crystalline semiconductor layer, an insulating layer, and a first single crystalline semiconductor layer are stacked, forming a score up to a layer above the desired separation portion in advance, that is, the second single crystalline semiconductor layer and the porous semiconductor peeling layer, and sealing the surface of the first single crystalline semiconductor layer and the interior of the score by a resin protective film, strain due to curing shrinkage stress of the resin protective film is applied, the efficiency of separating the support substrate using the porous semiconductor peeling layer as an interface is good, and the yield, quality, and productivity can be improved. Further, since the semiconductor chip, particularly the solid-state image pickup device, can be held while protecting the surface of the resin protective film and the projecting connection electrode surface by conductive protective tape free from residual conductive adhesive, static electricity damage is prevented, bump connection failure is prevented, and further chip breakage, chipping, and cracking are prevented, so the yield, quality, and the reliability are improved.

According to another aspect of the present invention, by forming a base comprised of a support substrate on which an ion implanted peeling layer, a second single crystalline semiconductor layer, an insulating layer, and a first single crystalline semiconductor layer are stacked, forming a score in the layer above the desired separation portion in advance, that is, the layer from the first single crystalline semiconductor layer to the ion implanted peeling layer, and sealing the surface of the first single crystalline semiconductor layer and the interior of the score by a resin protective film, strain due to curing shrinkage stress of the resin protective film is applied, the efficiency of separating by tension the support substrate by the strain of the ion implanted peeling layer is good, and the yield, quality, and productivity can be improved. Further, since the semiconductor chip, particularly the solid-state image pickup device, can be held while protecting the surface of the resin protective film and the projecting connection electrode surface by conductive protective tape free from residual conductive adhesive, static electricity damage is prevented, bump connection failure is prevented, and further chip breakage, chipping, and cracking are prevented, so the yield, quality, and the reliability are improved.

According to another aspect of the invention, by inserting as an insulating layer inserted between the first single crystalline semiconductor layer and the second single crystalline semiconductor layer not only a single layer of silicon oxide, but also a silicon nitride-based film having an appropriate thickness such as a silicon oxynitride film or a multilayer film of silicon oxide, silicon nitride, and silicon oxide, the yield and the quality are further improved.

Namely, contamination due to a halogen element (Na ions etc.) from the support substrate side when packaging or during the device process can be prevented.

Further, it is possible to reduce or prevent warping and strain of the first single crystalline semiconductor layer for preparing the device due to expansion by oxidation of the porous semiconductor peeling layer during the device process.

Further, at the time of etching away the second single crystalline semiconductor layer and the porous semiconductor peeling layer, the insulating layer acts as an etching stopper, so a high precision sensor unit can be fabricated and a solid-state image pickup device having a high sensitivity and a high precision is obtained.

Further, the insulating layer has a high performance, so has little leakage current, is able to give a good low noise characteristic, and further can be used also as an anti-reflection film.

Further, the ultra-thin SOI substrate of the present invention enables the leakage current to be suppressed low, the LSI to be speed up, and the operating voltage to be lowered resulting in lower power consumption and reduced cost.

Further, in the method of production of an ultra-thin back-illuminated solid-state image pickup device according to other aspects of the present invention, after the step of separation into the individual solid-state image pickup device, by removing the second single crystalline semiconductor layer to form a resin protective film projecting from the surface of the insulating layer by only exactly an amount corresponding to the thickness of the second single crystalline semiconductor layer and surrounding the side walls of the solid-state image pickup device and by affixing a transparent substrate to the solid-state image pickup device from the insulating layer side using the amount of the projection of the resin protective film as an air gap, a back-illuminated solid-state image pickup device of an extremely thin chip size hollow package is obtained.

Further, in the method of production of an ultra-thin back-illuminated solid-state image pickup device of these aspects of the present invention, after the step of peeling off the support substrate and before the step of separation to the individual solid-state image pickup devices, by positioning by observing an alignment mark of the first single crystalline semiconductor layer and an alignment mark of a color filter substrate via a transparent resin protective film, affixing the color filter substrate from the insulating layer side of the solid-state image pickup device, dicing it from the color filter substrate side along the resin protective film filled in the score, and separating the individual solid-state image pickup device, a color back-illuminated solid-state image pickup device of an extremely thin chip size is obtained.

Further, according to the production apparatus of an ultra-thin semiconductor device of the present invention, particularly the production apparatus of an ultra-thin back-illuminated solid-state image pickup device, when discharging fluid to a substrate having at least two layers of porous semiconductor peeling layer inside it to separate the substrate using a predetermined porous semiconductor peeling layer as an interface, by providing a stopper portion for preventing the fluid from the discharging portion from striking the other porous semiconductor peeling layer, the peeling action due to the fluid is prevented from acting upon the other porous semiconductor peeling layer, and the substrate can be separated using the intended porous semiconductor peeling layer as an interface, so the efficiency of separating the support substrate using the porous semiconductor peeling layer as an interface can be further raised, and the yield, quality, and productivity can be further improved.

Further, according to the production apparatus of an ultra-thin semiconductor device of the present invention, particularly the production apparatus of an ultra-thin back-illuminated solid-state image pickup device, by emitting a laser beam to a substrate having at least two layers of porous semiconductor peeling layers or ion implanted peeling layers inside this to separate the substrate using a predetermined porous semiconductor peeling layer or ion implanted peeling layer as an interface, the substrate can be separated with a relatively small force. Particularly, in the present invention, the target of the laser beam is a porous semiconductor peeling layer or an ion implanted peeling layer, so the separation by this laser beam can be carried out with a high precision and a high efficiency. Accordingly, the yield, quality, and productivity can be further improved.

While the invention has been described with reference to specific embodiments chosen for purpose of illustration, it should be apparent that numerous modifications could be made thereto by those skilled in the art without departing from the basic concept and scope of the invention.

The invention claimed is:

1. A method of production of an ultra-thin semiconductor device comprising the steps of:
    forming a base comprised of a support substrate on which a second porous semiconductor peeling layer, a second single crystalline semiconductor layer, an insulating layer, and a first single crystalline semiconductor layer are stacked and forming a semiconductor device unit and projecting connection electrodes to be connected to the semiconductor device unit at said first single crystalline semiconductor layer;
    forming a score along a separation line for separation to an individual semiconductor device from said first single crystalline semiconductor layer side until at least said second porous semiconductor peeling layer of said base is reached;
    forming a resin protective film filling an interior of said score and covering the surface of said first single crystalline semiconductor layer;
    exposing said projecting connection electrodes at the surface by polishing one surface of the resin protective film;
    covering the resin protective film surface and said projecting connection electrode surfaces by a conductive protective tape free from residual;
    peeling off said support substrate using said second porous semiconductor peeling layer as an interface; and
    dicing from said second crystalline semiconductor layer side along said resin protective film filled in said score to separate an individual semiconductor device.

2. A method of production of an ultra-thin semiconductor device as set forth in claim 1, further comprising, in the step of peeling off said support substrate at said second porous semiconductor peeling layer as an interface, spraying a fluid from a lateral direction to said second porous semiconductor peeling layer while rotating to peel off said support substrate.

3. A method of production of an ultra-thin semiconductor device as set forth in claim 1, further comprising, in the step of peeling off said support substrate at said second porous semiconductor peeling layer as an interface, emitting a laser beam from a lateral direction to said second porous semiconductor peeling layer while rotating to peel off said support substrate.

4. A method of production of an ultra-thin semiconductor device as set forth in claim 1, wherein said step of forming a base comprises the steps of:
    forming a first porous semiconductor peeling layer at a seed substrate; forming said first single crystalline semiconductor layer on said first porous semiconductor peeling layer;
    forming said second porous semiconductor peeling layer on said support substrate;
    forming said second single crystalline semiconductor layer on said second porous semiconductor peeling layer;
    forming said insulating layer on at least one of said first single crystalline semiconductor layer and said second single crystalline semiconductor layer;
    bonding said seed substrate and said support substrate from said first single crystalline semiconductor layer and said second single crystalline semiconductor layer sides in the state with said insulating layer interposed;
    peeling off said seed substrate at said first porous semiconductor peeling layer as an interface; and
    etching the surface of said first single crystalline semiconductor layer by hydrogen annealing.

5. A method of production of an ultra-thin semiconductor device as set forth in claim 4, further comprising, in the step of peeling off said seed substrate at said first porous semiconductor peeling layer as an interface, spraying a fluid from a lateral direction to said first porous semiconductor peeling layer while rotating to peel off said seed substrate.

6. A method of production of an ultra-thin semiconductor device as set forth in claim 4, further comprising, in the step of peeling off said seed substrate at said first porous semiconductor peeling layer as an interface, emitting a laser beam from a lateral direction to said first porous semiconductor peeling layer while rotating to peel off said seed substrate.

7. A method of production of an ultra-thin semiconductor device as set forth in claim 4, further comprising, in the step of forming said insulating layer, forming said insulating layer including at least one type of film among a silicon oxide film, a silicon nitride film, a multilayer film of a silicon oxide film and silicon nitride film, a multilayer film of a silicon oxide film, a silicon nitride film, and a silicon oxide film, a silicon oxynitride film, and an aluminum oxide film.

8. A method of production of an ultra-thin semiconductor device as set forth in claim 4, further comprising, in the steps of forming said first porous semiconductor peeling layer and said second porous semiconductor peeling layer, forming said layer by forming an impurity doped layer comprised of a single crystalline semiconductor layer including an impurity and converting it to a porous semiconductor by anodic conversion.

9. A method of production of an ultra-thin semiconductor device as set forth in claim 4, further comprising, in the steps of forming said first porous semiconductor peeling layer and said second porous semiconductor peeling layer, forming said layers by making a porosity and thickness of said first porous semiconductor peeling layer larger than those of said second porous semiconductor peeling layer so as to enable peeling off at said first porous semiconductor peeling layer as an interface compared with said second porous semiconductor peeling layer when peeling off said seed substrate.

10. A method of production of an ultra-thin semiconductor device as set forth in claim 4, further comprising, in the steps of forming said first porous semiconductor peeling layer and said second porous semiconductor peeling layer, forming the layer by at least two layers of different porosities.

11. A method of production of an ultra-thin semiconductor device as set forth in claim 1, further comprising, in the step of separation to an individual semiconductor device, dicing by a width narrower than a width of said score and at the substantial center of said score so that part of said resin protective film covers the side surfaces of said first single crystalline semiconductor layer, said insulating layer, and said second single crystalline semiconductor layer separated by the dicing.

12. A method of production of an ultra-thin back-illuminated solid-state image pickup device comprising the steps of:
    forming a base comprised of a support substrate on which a second porous semiconductor peeling layer, a second single crystalline semiconductor layer, an insulating layer, and a first single crystalline semiconductor layer are stacked and forming a solid-state image pickup sensor unit and projecting connection electrodes to be connected to the solid-state image pickup sensor unit at said first single crystalline semiconductor layer;
    forming a score along a separation line for separation to an individual solid-state image pickup device from said first single crystalline semiconductor layer side until at least said second porous semiconductor peeling layer of said base is reached;
    forming a resin protective film filling an interior of said score and covering the surface of said first single crystalline semiconductor layer;
    exposing said projecting connection electrodes at the surface by polishing one surface of the resin protective film;
    covering the resin protective film surface and aid projecting connection electrode surfaces by a conductive protective tape free from residual; peeling off said support substrate using said second porous semiconductor peeling layer as an interface; and
    dicing from said second crystalline semiconductor layer side along said resin protective film filled in said score to separate an individual solid-state image pickup device.

13. A method of production of an ultra-thin back-illuminated solid-state image pickup device as set forth in claim 12, further comprising, in the step of peeling off said support substrate at said second porous semiconductor peeling layer as an interface, spraying a fluid from a lateral direction to said second porous semiconductor peeling layer while rotating to peel off said support substrate.

14. A method of production of an ultra-thin back-illuminated solid-state image pickup device as set forth in claim 12, further comprising, in the step of peeling off said support substrate at said second porous semiconductor peeling layer as an interface, emitting a laser beam from a lateral direction to said second porous semiconductor peeling layer while rotating to peel off said support substrate.

15. A method of production of an ultra-thin back-illuminated solid-state image pickup device as set forth in claim 12, wherein said step of forming a base comprises the steps of:
- forming a first porous semiconductor peeling layer at a seed substrate; forming said first single crystalline semiconductor layer on said first porous semiconductor peeling layer;
- forming said second porous semiconductor peeling layer on said support substrate; forming said second single crystalline semiconductor layer on said second porous semiconductor peeling layer;
- forming said insulating layer on at least one of said first single crystalline semiconductor layer and said second single crystalline semiconductor layer;
- bonding said seed substrate and said support substrate from said first single crystalline semiconductor layer and said second single crystalline semiconductor layer sides in the state with said insulating layer interposed;
- peeling off said seed substrate at said first porous semiconductor peeling layer as an interface; and
- etching the surface of said first single crystalline semiconductor layer by hydrogen annealing.

16. A method of production of an ultra-thin back-illuminated solid-state image pickup device as set forth in claim 15, further comprising, in the step of peeling off said seed substrate at said first porous semiconductor peeling layer as an interface, spraying a fluid from a lateral direction to said first porous semiconductor peeling layer while rotating to peel off said seed substrate.

17. A method of production of an ultra-thin back-illuminated solid-state image pickup device as set forth in claim 15, further comprising, in the step of peeling off said seed substrate at said first porous semiconductor peeling layer as an interface, emitting a laser beam from a lateral direction to said first porous semiconductor peeling layer while rotating to peel off said seed substrate.

18. A method of production of an ultra-thin back-illuminated solid-state image pickup device as set forth in claim 15, further comprising, in the step of forming said insulating layer, forming said insulating layer including at least one type of film among a silicon oxide film, a silicon nitride film, a multilayer film of a silicon oxide film and silicon nitride film, a multilayer film of a silicon oxide film, a silicon nitride film, and a silicon oxide film, a silicon oxynitride film, and an aluminum oxide film.

19. A method of production of an ultra-thin back-illuminated solid-state image pickup device as set forth in claim 15, further comprising, in the steps of forming said first porous semiconductor peeling layer and said second porous semiconductor peeling layer, forming said layer by forming an impurity doped layer comprised of a single crystalline semiconductor layer including an impurity and converting it to a porous semiconductor by anodic conversion.

20. A method of production of an ultra-thin back-illuminated solid-state image pickup device as set forth in claim 15, further comprising, in the steps of forming said first porous semiconductor peeling layer and said second porous semiconductor peeling layer, forming said layers by making a porosity and thickness of said first porous semiconductor peeling layer larger than those of said second porous semiconductor peeling layer so as to enable peeling off at said first porous semiconductor peeling layer as an interface compared with said second porous semiconductor peeling layer when peeling off said seed substrate.

21. A method of production of an ultra-thin back-illuminated solid-state image pickup device as set forth in claim 15, further comprising, in the steps of forming said first porous semiconductor peeling layer and said second porous semiconductor peeling layer, forming the layer by at least two layers of different porosities.

22. A method of production of an ultra-thin back-illuminated solid-state image pickup device as set forth in claim 12, further comprising, in the step of separation to an individual solid-state image pickup device, dicing by a width narrower than a width of said score and at the substantial center of said score so that part of said resin protective film covers the side surfaces of said first single crystalline semiconductor layer, said insulating layer, and said second single crystalline semiconductor layer separated by the dicing.

23. A method of production of an ultra-thin back-illuminated solid-state image pickup device as set forth in claim 12, further comprising, after the step of separation to an individual solid-state image pickup device, the steps of:
- removing said second single crystalline semiconductor layer to form said resin protective layer projecting up from the surface of said insulating layer by exactly an amount corresponding to the thickness of said second single crystalline semiconductor layer and covering the side surfaces of said solid-state image pickup device and
- affixing a transparent substrate to said solid-state image pickup device from said insulating layer side using the amount of projection of said resin protective layer as an air gap.

24. A method of production of an ultra-thin back-illuminated solid-state image pickup device as set forth in claim 12,
- further comprising, after the step of peeling off said support substrate at said second porous semiconductor peeling layer as an interface and before the step of separation to an individual solid-state image pickup device, a step of affixing a color filter substrate from said insulating film side of said solid-state image pickup device and
- further comprising, in said step of separation to an individual solid-state image pickup device, dicing from said color filter substrate side along said resin protective film filling said score to separate said individual solid-state image pickup device.

25. A method of production of an ultra-thin back-illuminated solid-state image pickup device as set forth in claim 24,
- further comprising, in said step of forming a resin protective film, forming a transparent resin protective film and
- further comprising, in said step of affixing said color filter substrate, positioning by monitoring an alignment mark of said first single crystalline semiconductor layer through said resin protective film and an alignment mark of said color filter substrate, then affixing said color filter substrate.

26. A method of production of an ultra-thin back-illuminated solid-state image pickup device as set forth in claim 12,
- further comprising, after said step of peeling off said support substrate at said second porous semiconductor peeling layer as an interface and before said step of separation to an individual solid-state image pickup device, the steps of removing said second single crystalline semiconductor layer to expose said insulating layer, forming an on-chip color filter including a pigment on said exposed insulating layer, and forming an on-chip microlens on said on-chip color filter and further comprising, before or after said step of separation into an individual solid-state image pickup device, the step of affixing a transparent substrate on said solid-state image pickup sensor unit from said on-chip microlens side with a predetermined air gap determined by a diameter of a spacer in a sealing agent.

* * * * *